US012730142B2

(12) United States Patent
Ichikawa

(10) Patent No.: US 12,730,142 B2
(45) Date of Patent: Sep. 8, 2026

(54) TEST SUBSTRATE, TEST APPARATUS, AND TEST METHOD FOR SEMICONDUCTOR INTEGRATED CIRCUIT

(71) Applicant: Kioxia Corporation, Tokyo (JP)

(72) Inventor: Taisuke Ichikawa, Yokohama (JP)

(73) Assignee: Kioxia Corporation, Tokyo (JP)

( * ) Notice: Subject to any disclaimer, the term of this patent is extended or adjusted under 35 U.S.C. 154(b) by 402 days.

(21) Appl. No.: 18/463,558

(22) Filed: Sep. 8, 2023

(65) Prior Publication Data

US 2024/0192269 A1 Jun. 13, 2024

(30) Foreign Application Priority Data

Dec. 13, 2022 (JP) ................................ 2022-198629

(51) Int. Cl.
*G01R 31/28* (2006.01)

(52) U.S. Cl.
CPC ................................ *G01R 31/2875* (2013.01)

(58) Field of Classification Search
CPC ............ G01R 31/2856; G01R 31/2875; G01R 31/2877
See application file for complete search history.

(56) References Cited

U.S. PATENT DOCUMENTS

| | | | | |
|---|---|---|---|---|
| 6,476,627 | B1 | 11/2002 | Pelissier et al. | |
| 6,549,026 | B1 | 4/2003 | Dibattista et al. | |
| 6,580,283 | B1 * | 6/2003 | Carbone ........... | G01R 31/2886 324/750.19 |
| 2008/0211072 | A1 * | 9/2008 | Sangaunwong ... | G01R 31/2863 257/676 |

FOREIGN PATENT DOCUMENTS

| | | | |
|---|---|---|---|
| JP | H10142289 | A | 5/1998 |
| JP | 2004157002 | A | 6/2004 |
| JP | 5000536 | B2 | 8/2012 |

* cited by examiner

*Primary Examiner* — Tung X Nguyen
(74) *Attorney, Agent, or Firm* — Maier & Maier, PLLC

(57) ABSTRACT

According to one embodiment, a test substrate of a semiconductor integrated circuit includes: a substrate connected between a burn-in apparatus and a burn-in board on which a semiconductor integrated circuit which is a device under test is mounted, and a test circuit disposed on the substrate and configured to extend a connection interface configuration between the burn-in apparatus and the burn-in board.

7 Claims, 28 Drawing Sheets

1
BURN-IN TEST APPARATUS
TEST FURNACE
400
200
BI APPAR
210
PSU
220
CU
230
DU
240
MU
SOCKET
290_1
290_2
290_n
CXN
CONN
180_1
180_2
180_n
TEST SUBSTRATE
100_1
100_2
100_n
TEST CIRCUIT
110_1
110_2
110_n
SOCKET
190_1
190_2
190_n
CONN
380_1
380_2
380_n
BURN-IN BOARD
300_1
300_2
300_n
SKT TML
DUT
310_11
310_1m
310_21
310_2m
310_n1
310_nm
320_11
320_1m
320_21
320_2m
320_n1
320_nm

FIG. 6B
| x1 | x2 | O1 | O2 | O3 |
|---|---|---|---|---|
| L | L | Hi-Z | Hi-Z | Hi-Z |
| L | H | I | Hi-Z | Hi-Z |
| H | L | Hi-Z | I | Hi-Z |
| H | H | Hi-Z | Hi-Z | I |
FIG. 7A
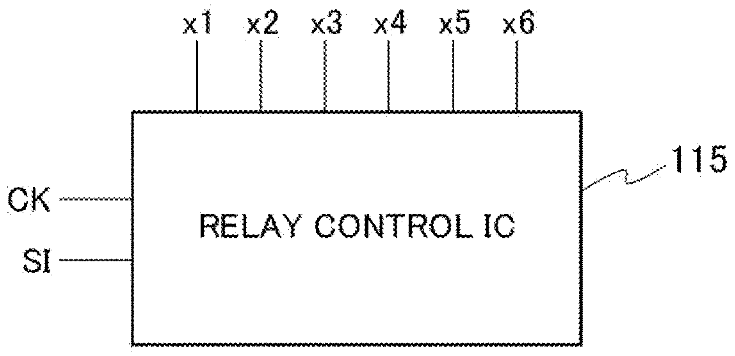
FIG. 7B
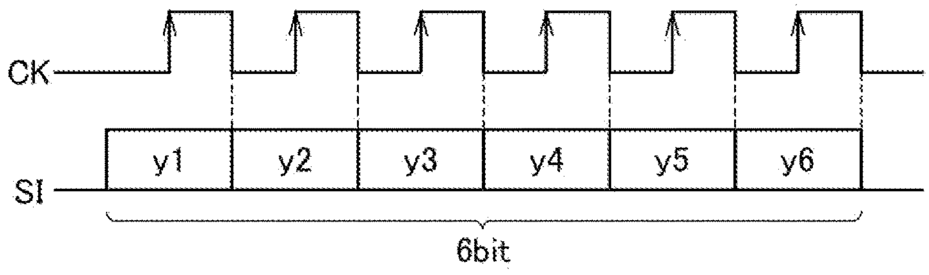

110A
111
RELAY A
INPUT 1
I
x1 L
x2 H
I O1
Hi-Z O2
Hi-Z O3
OUTPUT 1 =INPUT 1
111
RELAY B
INPUT 2
I
x1 L
x2 L
Hi-Z O1
Hi-Z O2
Hi-Z O3
OUTPUT 2 =INPUT 3
111
RELAY C
INPUT 3
I
x1 H
x2 L
Hi-Z O1
I O2
Hi-Z O3
OUTPUT 3 =Hi-Z
CK
SI
L H L L H L
RELAY CONTROL IC
115

BURN-IN BOARD 300
DUT 320
DUT 320
DUT 320
DUT 320
CONNECTOR 380
LCPW
LCPW
LCPW
LCPW
SOCKET 190
TEST SUBSTRATE 100
POWER SUPPLY CIRCUIT 110B
DC/DC CONVERTER 112
DC/DC CONVERTER 112
DC/DC CONVERTER 112
DC/DC CONVERTER 112
CONNECTOR 180
SOCKET 290
BURN-IN APPARATUS 200
PCTL
CONTROL UNIT 220
PW
POWER SUPPLY UNIT 210
DRIVING UNIT 230
MEASURING UNIT 240

1

BURN-IN TEST APPARATUS

200
BURN-IN APPARATUS
210 PSU
220 CU
230 DU
240 MU

400
TEST FURNACE

290_1 SOCKET
CXN
380_1 CONN
BURN-IN BOARD 300_1
DUT 320_11
SKT TML 310_11
DUT 320_1m
SKT TML 310_1m

290_2 SOCKET
CXN
380_2 CONN
BURN-IN BOARD 300_2
DUT 320_21
SKT TML 310_21
DUT 320_2m
SKT TML 310_2m

290_3 SOCKET
CXN
380_3 CONN
BURN-IN BOARD 300_3
DUT 320_31
SKT TML 310_31
DUT 320_3m
SKT TML 310_3m

290_n SOCKET
CXN
380_n CONN
BURN-IN BOARD 300_n
DUT 320_n1
SKT TML 310_n1
DUT 320_nm
SKT TML 310_nm

1
BURN-IN TEST APPARATUS
400
TEST FURNACE
200
BURN-IN APPARATUS
210
PSU
220
CU
230
DU
240
MU
290_1
SOCKET
290_2
290_3
290_4
290_n−1
290_n
CXN
180_1
CONN
180_2
180_3
180_4
180_n−1
180_n
TST SUB
100A_2
100A_4
100A_n
190A_2
190A_4
190A_n
380_2
380_4
380_n
BURN-IN BOARD
300_2
300_4
300_n
SKT TML
DUT
310_21
310_41
310_n1
320_21
320_41
320_n1
310_2m
310_4m
310_nm
320_2m
320_4m
320_nm

1
BURN-IN TEST APPARATUS
300_2
BURN-IN BOARD
380_2
100A_2
190_2
180_1
180_2
290_1
290_2
200
210
POWER SUPPLY UNIT
BURN-IN APPARATUS

BURN-IN TEST APPARATUS
1
450
FAN
200
210
PSU
220
CU
230
DU
240
MU
BURN-IN APPARATUS
290_1
380_1
320_11
320_1m
310_11
310_1m
451
SOCKET
CXN
CONN
DUT
SKT TML
BURN-IN BOARD
300_1
290_2
380_2
320_21
320_2m
310_21
310_2m
300_2
290_3
380_3
320_31
320_3m
310_31
310_3m
300_3
290_4
380_4
320_41
320_4m
310_41
310_4m
300_4
TEST FURNACE
400

220
CONTROL UNIT
SEL1
SEL2
SCTL
210
POWER SUPPLY UNIT
230
DRIVING UNIT
240
MEASURING UNIT
BURN-IN APPARATUS
200
SOCKET
290
CONNECTOR
180
115
114
SELECTION CIRCUIT
110C
TEST SUBSTRATE
100
SOCKET
190
CONNECTOR
380
320
DUT
320
DUT
320
DUT
BURN-IN BOARD
300

220
CONTROL UNIT
SCTL1
SCTL2
210
POWER SUPPLY UNIT
230
DRIVING UNIT
240
MEASURING UNIT
BURN-IN APPARATUS
200
SOCKET
290
CONNECTOR
180
116
SELECTION CIRCUIT
110D
TEST SUBSTRATE
100
SOCKET
190
CONNECTOR
380
320
DUT
320
DUT
320
DUT
BURN-IN BOARD
300

400
GROUP 1
GROUP 2
TEST FURNACE
SOCKET
CXN
CONN
TEST SUBSTRATE
TEST CIRCUIT
BURN-IN BOARD
DUT
SKT TML
290_1
180_1
100_1
110_1
190_1
320_11
380_1
310_11
320_1m
310_1m
300_1
290_2
180_2
100_2
110_2
190_2
320_21
380_2
310_21
320_2m
310_2m
300_2
290_3
180_3
100_3
110_3
190_3
320_31
380_3
310_31
320_3m
310_3m
300_3
290_4
180_4
100_4
110_4
190_4
320_41
380_4
310_41
320_4m
310_4m
300_4
290_5
180_5
100_5
110_5
190_5
320_51
380_5
310_51
320_5m
310_5m
300_5
290_6
180_6
100_6
110_6
190_6
320_61
380_6
310_61
320_6m
310_6m
300_6

(a) GROUP 1 SELECTION SIGNAL
(b) GROUP 2 SELECTION SIGNAL
(c) CONTROL SIGNAL
(d) GROUP 1
(e) GROUP 2
(f) TIME
GROUP 1 ONLY OPERATES
DUT OF GROUP 1 GENERATES HEAT
GROUP 2 ONLY OPERATES
DUT OF GROUP 2 GENERATES HEAT
GROUPS 1 AND 2 BOTH OPERATE
DUTS OF GROUPS 1 AND 2 BOTH GENERATE HEAT
T11
T12
T13
T14
T15
T16
T17
T18
T19
T20

300
BURN-IN BOARD
380
DRV/CMP
LCPW
190
100
110A
111
10_2
180
190
100
110B
112
10_1
180
PCTL/PW
RCTL/DRV/CMP
200
BURN-IN APPARATUS

300 BURN-IN BOARD
320 DUT
320 DUT
....
320 DUT

LCPW
DRV/CMP

100 TEST SUBSTRATE
110A SCRAMBLE CIRCUIT

100 TEST SUBSTRATE
110B POWER SUPPLY CIRCUIT
DRV/CMP

PW
PCTL
RCTL

200 BURN-IN APPARATUS
210 POWER SUPPLY UNIT
220 CONTROL UNIT
230 DRIVING UNIT
240 MEASURING UNIT

200
BURN-IN APPARATUS
210
POWER SUPPLY UNIT
220
CONTROL UNIT
230
DRIVING UNIT
240
MEASURING UNIT
PW
PCTL
100
TEST SUBSTRATE
110B
POWER SUPPLY CIRCUIT
RCTL
DRV/CMP
100
TEST SUBSTRATE
SCTL/SEL1/SEL2
110A
SCRAMBLE CIRCUIT
100
TEST SUBSTRATE
110C
SELECTION CIRCUIT
DRV/CMP
LCPW
SEL1/SEL2
300
BURN-IN BOARD
320
DUT
320
DUT
320
DUT

200
BURN-IN APPARATUS
210
POWER SUPPLY UNIT
220
CONTROL UNIT
230
DRIVING UNIT
240
MEASURING UNIT
PW
PW
100
TEST SUBSTRATE
110E
POWER SUPPLY CIRCUIT
RCTL
DRV/CMP
100
TEST SUBSTRATE
SCTL/SEL1/SEL2
110A
SCRAMBLE CIRCUIT
100
TEST SUBSTRATE
110C
SELECTION CIRCUIT
DRV/CMP
LPW
SEL1/SEL2
300
BURN-IN BOARD
320
DUT
320
DUT
320
DUT

S104
TEST IS STARTED
S1041
TURN ON DUT
S1042
TEST SIGNAL IS SUPPLIED TO EACH PIN
S1043
TEST SIGNAL IS SUPPLIED TO DUT
S1044
END

S105
TEST IS ENDED
S1051
TURN OFF DUT
S1052
SUPPLYING TEST SIGNAL TO EACH PIN IS STOPPED
S1053
SUPPLYING TEST SIGNAL TO DUT IS STOPPED
S1054
END

TEST SUBSTRATE, TEST APPARATUS, AND TEST METHOD FOR SEMICONDUCTOR INTEGRATED CIRCUIT

CROSS REFERENCE TO RELATED APPLICATIONS

This application is based upon and claims the benefit of priority from prior Japanese Patent Application No. P2022-198629 filed on Dec. 13, 2022, the entire contents of which are incorporated herein by reference.

FIELD

Embodiments described herein relate generally to a test substrate for a semiconductor integrated circuit, a test apparatus, and a test method.

BACKGROUND

Semiconductor integrated circuits (hereinafter also referred to as the Device Under Test (DUT)), such as semiconductor storage devices, have been subjected to stress tests for suppressing an occurrence of initial failures, reliability tests for verify reliability of products, and the like. Such stress tests include, for example, burn-in (BI) tests and the like, and such reliability tests include, for example, environmental tests, long-term life tests, and the like. During burn-in tests, a burn-in board (BI board) are used on which DUTs in a state of, for example, being cut from a wafer and packaged in a mold resin are mounted. The burn-in tests are executed in a state of the burn-in boards are housed in a test furnace (hereinafter also referred to as the chamber) provided in a test apparatus.

BRIEF DESCRIPTION OF THE DRAWINGS

FIG. 6B is a diagram illustrating an example of a truth table for the relay element illustrated in FIG. 6A.

FIG. 7A is a block diagram schematically illustrating an example of input/output signals of a relay control IC included in the scramble circuit illustrated in FIG. 5.

FIG. 7B is a diagram illustrating an example of a timing chart of the relay control IC illustrated in FIG. 7A.

DETAILED DESCRIPTION

Figure 1:
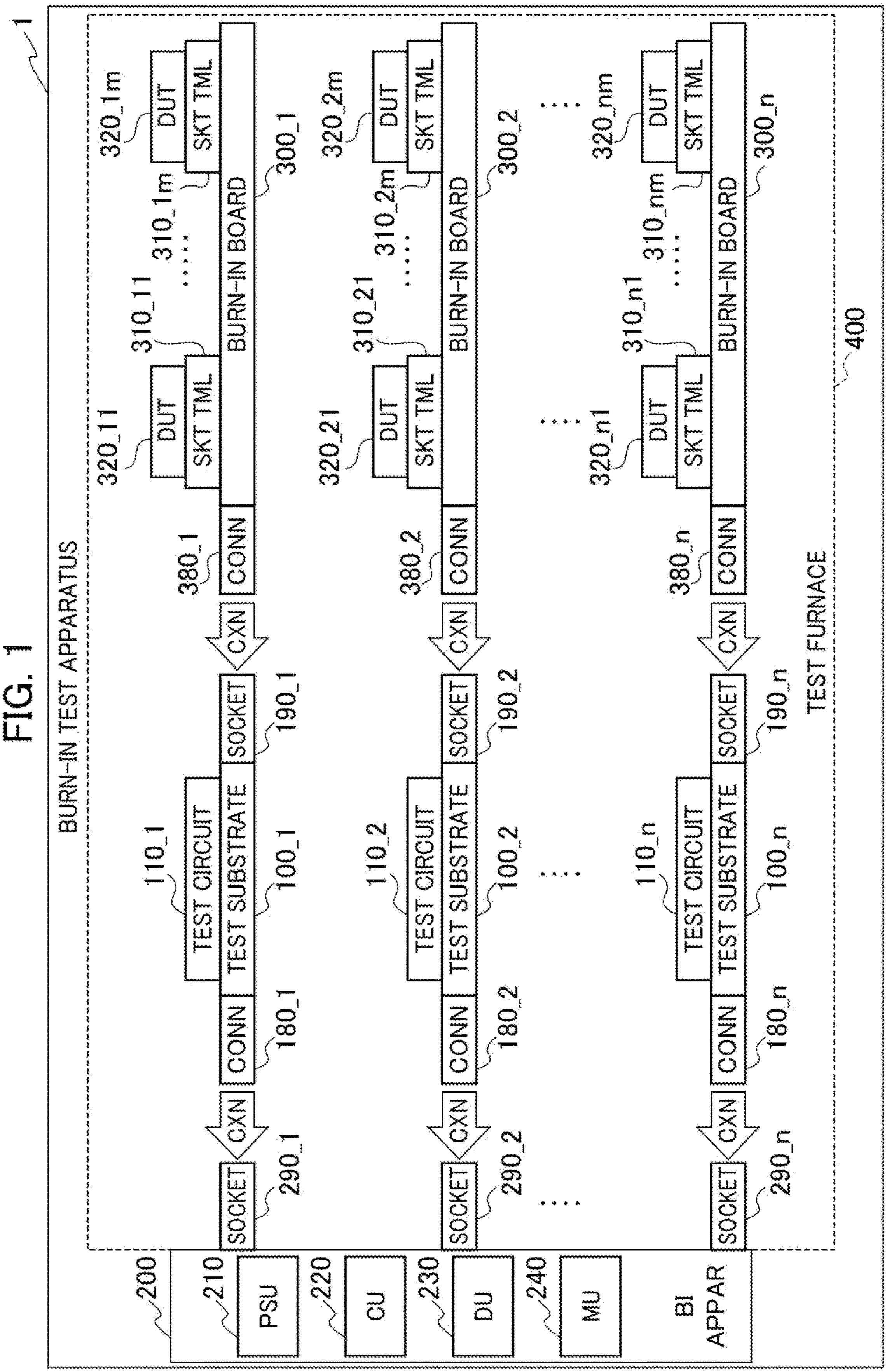
FIG. 1 is a block diagram schematically illustrating a schematic configuration example of a burn-in test apparatus which is a test apparatus of a semiconductor integrated circuit according to embodiments.

Next, certain embodiments will now be explained with reference to drawings. In the description of the following specification or drawings to be explained, the identical or similar reference sign is attached to the identical or similar part. However, the drawings are merely schematic. Moreover, the embodiments described hereinafter merely exemplify a device and/or a method for materializing the technical idea. The embodiments may be changed without departing from the spirit or scope of claims.

Certain embodiments provide a test substrate for a semiconductor integrated circuit, a test apparatus, and a test method, capable of efficiently using resources in a burn-in apparatus, capable of absorbing structural differences between respective DUTs, and capable of suppressing environmental variations in a test furnace.

In general, according to the embodiment, a test substrate includes a substrate connected between a burn-in apparatus and a burn-in board on which a semiconductor integrated circuit which is a device under test (DUT) is mounted, and a test circuit disposed on the substrate and configured to extend a connection interface configuration between the burn-in apparatus and the burn-in board.

Hereinafter, test substrates for semiconductor integrated circuits, test apparatuses, and test methods disclosed herein will be described with reference to the drawings.

(Burn-In Test Apparatus in Embodiments)

In test processes of semiconductor integrated circuits (DUTs), such as semiconductor storage devices, there is a burn-in test executed in a state where the DUTs are cut from a wafer and packaged in a mold resin. Such a burn-in test has, for example, the following three problems.

(1) Pin assignments between a burn-in apparatus and burn-in boards are not standardized, and there may be incompatible combinations. The term "pin assignment" used herein means an arrangement of pins and signals, obtained by, for example, determining what kind of signal (function) is assigned to each pin of DUTs. Specific examples of the pin assignment include, for example, input signals, output signals, power, ground (earth), and the like. In general, if a pin assignment of the DUT changes, the burn-in apparatus side also needs to be changed in accordance with the changed pin assignment of the DUT.

(2) It is difficult to efficiently use resources of the burn-in apparatus to execute tests. Resources of the burn-in apparatus include, for example, power supply resources, and the like.

(3) The increase in the number of simultaneous measurements of DUTs increases an environmental variation in a test furnace of the burn-in apparatus. Environmental variations in the test furnace include, for example, temperature variations in the test furnace.

Therefore, the embodiments provide a test substrate for a semiconductor integrated circuit, a test apparatus, and a test method, capable of efficiently using resources in a burn-in apparatus, capable of absorbing structural differences between respective DUTs, and capable of suppressing environmental variations in a test furnace.

Figure 2:
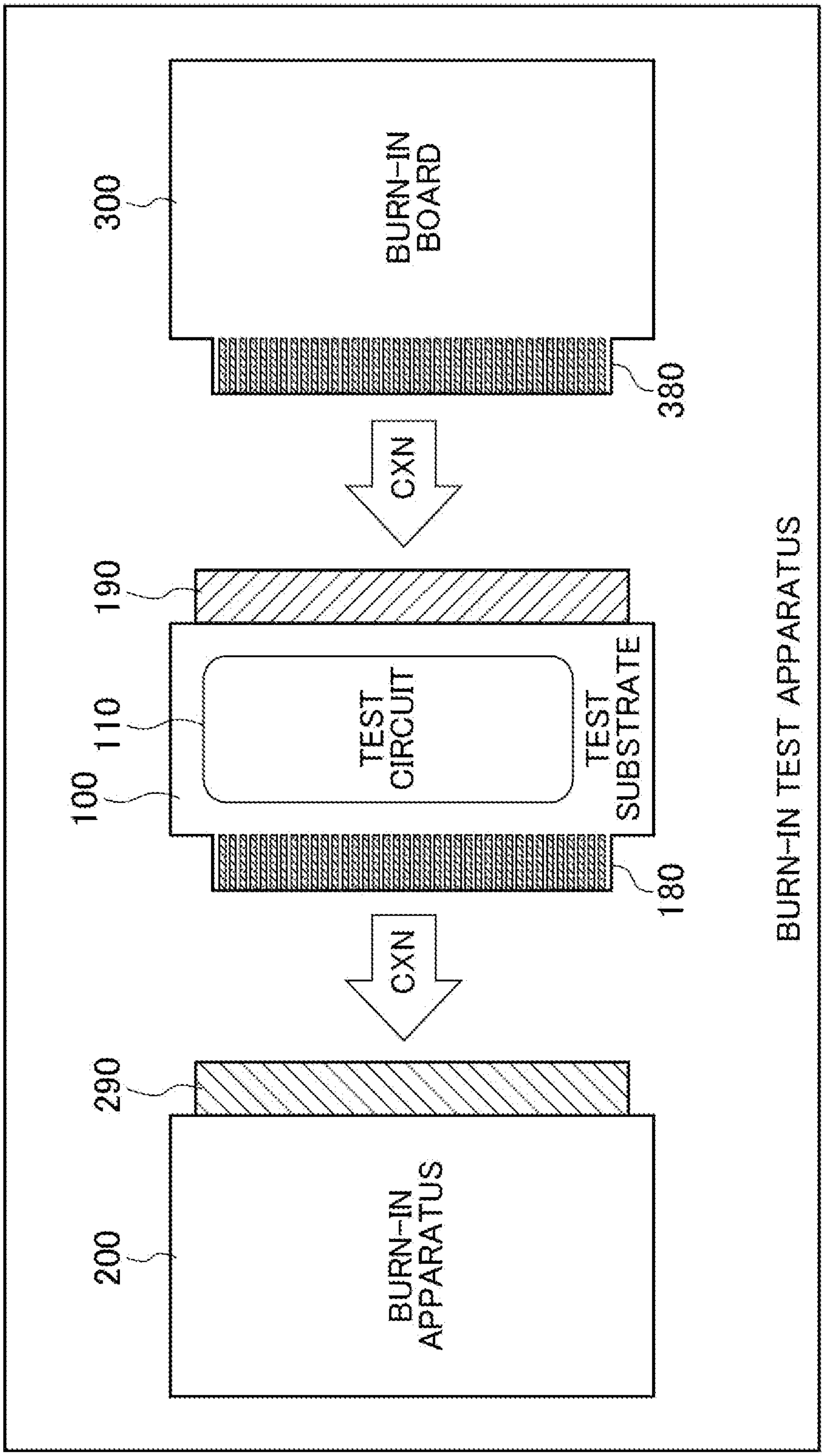
FIG. 2 is a block diagram schematically illustrating a connection example in the burn-in test apparatus illustrated in FIG. 1.

FIG. 1 schematically illustrates a schematic configuration example of a burn-in test apparatus 1, which is a test apparatus of a semiconductor integrated circuit, according to the embodiments. FIG. 2 schematically illustrates a connection example of the burn-in test apparatus 1 illustrated in FIG. 1.

The burn-in test apparatus 1 includes a configuration in which a test substrate (TST SUB) 100 (e.g., test substrates 100_1, 100_2, . . . , **100_*n*) is inserted between a burn-in apparatus (BI APPAR) 200 and a burn-in board 300 (e.g., burn-in boards 300_1, 300_2, . . . , 300_*n*). On the test substrate 100 (e.g., test substrates 100_1, 100_2, . . . , 100_*n*), a test circuit 110 (e.g., test circuits 110_1, 110_2, . . . , 110_*n*) configured to extend a connection interface configuration between the burn-in apparatus 200 and the burn-in board 300** is mounted.

The test circuit 110 includes, for example, a test circuit for efficiently using resources of the burn-in apparatus 200, a test circuit for absorbing a structural difference between the respective DUTs 320, and/or a test circuit for suppressing environmental variations in a test furnace 400 by controlling an operation timing for each burn-in board 300.

It is to be noted that FIG. 1 illustrates n burn-in boards 300_1, 300_2, . . . , **300_*n*, and n test substrates 100_1, 100_2, . . . , 100_*n* respectively corresponding to the burn-in boards 300_1, 300_2, . . . , 300_*n*. Here, n is an integer equal to or greater than 1. On the other hand, FIG. 2 illustrates a typical burn-in board 300 and a typical test substrate 100 among the n burn-in boards 300_1, 300_2, . . . , 300_*n*, and the n test substrates 100_1, 100_2, . . . , 100_*n***.

As illustrated in FIG. 1, a burn-in test apparatus 1 includes: a burn-in apparatus 200; a burn-in board 300 (burn-in boards 300_1, 300_2, . . . , **300_*n*) connected to the burn-in apparatus 200; a test substrate 100 (test substrates 100_1, 100_2, . . . , 100_*n*) inserted between the burn-in apparatus 200 and the burn-in board 300**.

The burn-in board 300 is a test board on which a device under test (DUT) 320 is mounted. Among the n burn-in boards 300_1, 300_2, . . . , **300_*n*, the burn-in board 300_1, for example, includes: an edge connector (CONN) 380_1; m burn-in socket terminals (SKT TMLs) 310_11, . . . , 310_1*m*; and devices under test (DUTs) 320_11, . . . , 320_1*m* respectively inserted into the burn-in socket terminals 310_11, . . . , 310_1*m*. Here, m is an integer equal to or greater than 1. It is to be noted that the pairs of the burn-in socket terminal 310 and the DUT 320 may be arranged in p-row×q-column matrix on the burn-in board 300. Here, p and q are both integers equal to or greater than 1, and p×q=m. The edge connector 380_1 is connected to and inserted into an edge connector socket (SOCKET) 190_1 of the test substrate 100_1**.

The test substrate 100 is a substrate on which a test circuit 110 (test circuits 110_1, 110_2, . . . , 110_*n*) configured to extend a connection interface configuration between the burn-in apparatus 200 and the burn-in board 300 is mounted. Among the n test substrates 100_1, 100_2, . . . , 100_*n*, the test substrate 100_1, for example, includes an edge connector socket 190_1, a test circuit 110_1, and an edge connector (CONN) 180_1. The edge connector 180_1 is connected to and inserted into an edge connector socket (SOCKET) 290_1 of the burn-in apparatus 200.

The burn-in apparatus 200 includes a power supply unit (PSU) 210, a control unit (CU) 220, a driving unit (DU) 230, and a measuring unit (MU) 240.

The control unit 220 is configured to control each unit in the burn-in apparatus 200, i.e., the power supply unit 210, the driving unit 230, the measuring unit 240, and the like, and also to execute control of the test substrate 100 side and the burn-in board 300 side through the edge connector socket 290.

The power supply unit 210 is configured to supply electric power to the test circuit 110 disposed on the test substrate 100, and the DUT 320 inserted into the burn-in socket terminal 310 provided on the burn-in board 300.

A driving unit 230 is configured to drive the test circuit 110 disposed on the test substrate 100 and the DUT 320 inserted into the burn-in socket terminal 310 provided on the burn-in board 300. Alternatively, when the DUT 320 is packaged with a control IC (controller) (not illustrated), the driving unit 230 drives the controller.

The measuring unit 240 compares an input voltage with a threshold value of high/low level with respect to the DUT 240 during the burn-in test.

The edge connector 180 (180_1, 180_2, . . . , 180_*n*) of the test substrate 100 (100_1, 100_2, . . . , 100_*n*) is connected to and inserted into the edge connector socket 290 (290_1, 290_2, . . . , 290_*n*) of the burn-in apparatus 200 (200_1, 200_2, . . . , 200_*n*), and the edge connector 380 (380_1, 380_2, . . . , 380_*n*) of the burn-in board 300 (300_1, 300_2, . . . , 300_*n*) is connected to and inserted into the edge connector socket 190 (190_1, 190_2, - - - , 190_*n*) of the test substrate 100, and thereby the burn-in apparatus 200 and the burn-in board 300 (300_1, 300_2, . . . , 300_*n*) are connected to each other through the test substrate 100 (100_1, 100_2, . . . , 100_*n*).

When testing the DUT 320, the burn-in board 300 and the test substrate 100 are housed in the test furnace 400.

First Embodiment

In general, a pin assignment between the burn-in apparatus 200 and the burn-in board 300 is not standardized, and there may be incompatible combinations. Moreover, the DUT 320 has various package shapes depending on the substrate and system to be mounted, and may be enclosed in the same package as the controller controlling the DUT 320.

When executing a burn-in test of the DUT 320 mounted in a package with a controller mounted, there are a case where the DUT 320 is directly operated without intervening the controller (i.e., pass-through control) and a case where the DUT 320 is indirectly operated intervening the controller (i.e., controller control).

Figure 3A:
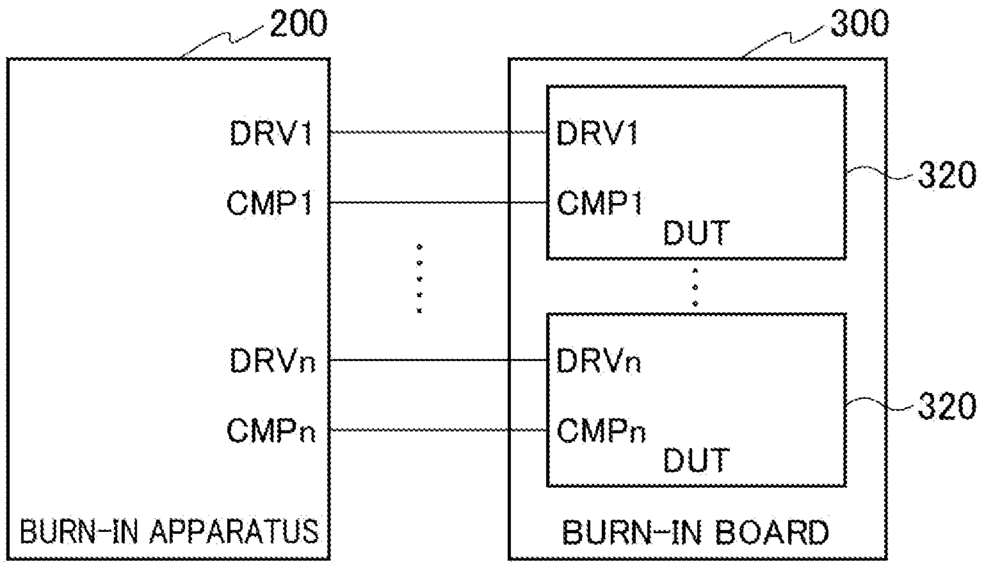
FIG. 3A is a block diagram schematically illustrating a configuration example of directly connecting a burn-in apparatus and a burn-in board to each other.
Figure 3B:
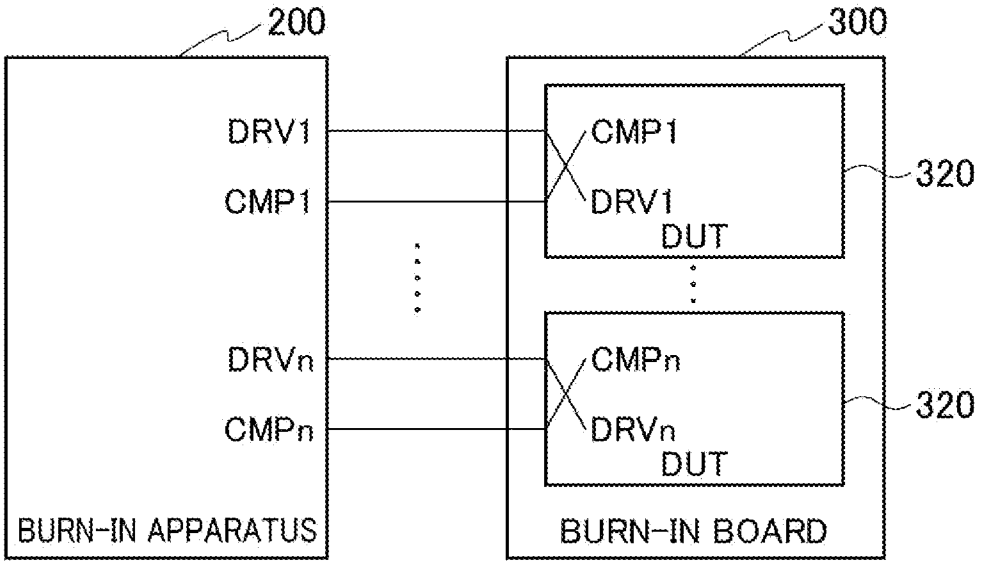
FIG. 3B is a block diagram schematically illustrating another configuration example the burn-in apparatus and the burn-in board to each other intervening a controller.

FIG. 3A schematically illustrates an example of a configuration of directly connecting the burn-in apparatus 200 and the burn-in board 300 to each other, without intervening the controller (pass-through control), and FIG. 3B schematically illustrates a configuration of indirectly connecting the burn-in apparatus 200 and the burn-in board 300 to each other intervening the controller (controller control).

When switching between the pass-through control and the controller control, an assignment of signal lines (e.g., driver DRV1, . . . , DRVn, and comparator CMP1, . . . , CMPn) between the burn-in apparatus 200 and the DUT 320 may change. More specifically, a function (e.g., control, determination) of each pin may change depending on whether the controller is used or is not used. For example, when the controller is not used (i.e., pass-through control), only a pin for controlling the DUT 320 (e.g., driver) is required, but when the controller is used (i.e., controller control), a pin for determination of the output the DUT 320 (e.g., comparator) may be required. However, an opposite case thereto is also satisfied.

When it is necessary to interchange such a driver and a comparator, it is difficult to change pin assignment flexibility at the burn-in apparatus 200 side since the pin assignment of the burn-in apparatus 200 is determined fixed in hardware.

Therefore, when testing under the pass-through control, a burn-in board as illustrated in FIG. 3A is required, and when testing under the controller control, a burn-in board as illustrated in FIG. 3B is required.

However, as the number of types of burn-in boards 300 increases, fabricating costs and maintenance costs correspondingly increase, and the switching of the burn-in boards 300 causes a waiting time for temperature increase/decrease, leading to a decrease in test efficiency. More specifically, when burn-in boards 300 are created individually for the case of the pass-through control and the case of the controller control, it is necessary to detach the burn-in board 300 for the pass-through control from the test furnace 400 after the test under the pass-through control is executed, then to place the burn-in board 300 for the controller control in the test furnace 400 to execute the test under the controller control. Since the temperature of the test furnace 400 is changed during the burn-in test, it is necessary to restore the temperature in the test furnace 400 to the original temperature in order to detach the burn-in board 300 therefrom. The time required for restoring the original temperature, and the time required for setting the temperature required for the test after exchanging the burn-in boards correspond to the "waiting times for temperature increase/decrease."

Since failure items to be detected are different between the test under the pass-through control and the test under the controller control, it is preferable to execute both of the test under the pass-through control and the test under the controller control in order to prevent defects from slipping through.

(Burn-In Test Apparatus According to First Embodiment)

Figure 4:
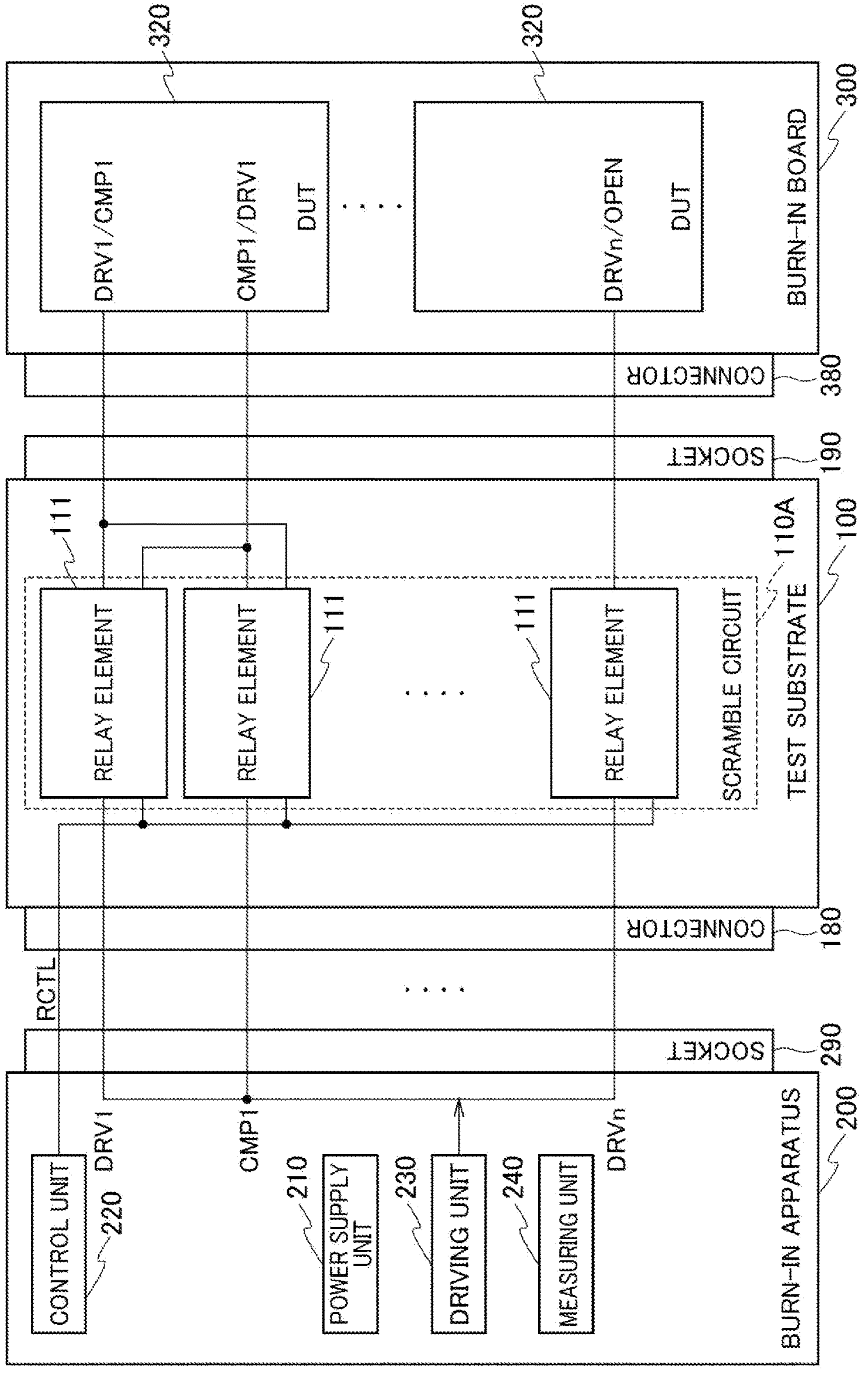
FIG. 4 is a block diagram schematically illustrating a schematic configuration example of a burn-in test apparatus according to a first embodiment.

FIG. 4 schematically illustrates a schematic configuration example of a burn-in t apparatus 1 according to a first embodiment. It is to be noted that description of parts that overlap with the components described in FIGS. 1 and 2 may be omitted.

In the burn-in test apparatus 1 according to the first embodiment, as illustrated in FIG. 4, a test substrate 100 is inserted between a burn-in apparatus 200 and a burn-in board 300, the burn-in apparatus 200 and the test substrate 100 are connected to each other, and the test substrate 100 and a burn-in board 300 are connected to each other.

The test substrate 100 includes a scramble circuit 110A disposed on the test substrate 100. The scramble circuit 110A includes a relay element 111. The relay element 111 is configured to be capable to freely changing a connection assignment between the burn-in apparatus 200 and the burn-in board 300 with regard to electric power, signal lines (DRV1, . . . , DRVn/CMP1, . . . , CMPn), and the like, which are supplied into the burn-in board 300 from burn-in apparatus 200. The relay element 111 is disposed for each electric power or signal line supplied to the burn-in board 300 from the burn-in apparatus 200. Control of the relay element 111 is realized by a relay control signal RCTL supplied from the burn-in apparatus 200. That is, in an example illustrated in FIG. 5, it is provided with a connection configuration of daisy chain for directly connecting the relay control signal RCTL to each relay element 111 for simultaneous control. The daisy chain is a method of connecting peripheral devices and the like with cables, in which a plurality of electronic devices are connected in a daisy chain or all electronic devices are combined into one loop.

The scramble circuit 110A is capable of changing an assignment of tester resources with respect to pins of the DUT 320. That is, the pin assignment is switched among a driver (e.g., control signals of the DUTs (output) (DRV1, . . . , DRVn)), a comparator (e.g., control and determination of the DUTs (input and output) (CMP1, . . . , CMPn)), and unconnected (Open), in accordance with the content of the test.

Consequently, even if the pin assignment (input/output/input and output) at the side of the burn-in board 300 is changed, it is possible to interchange the pin assignments on the scramble circuit 110A in accordance with the control signal RCTL from the burn-in apparatus 200.

Figure 5:
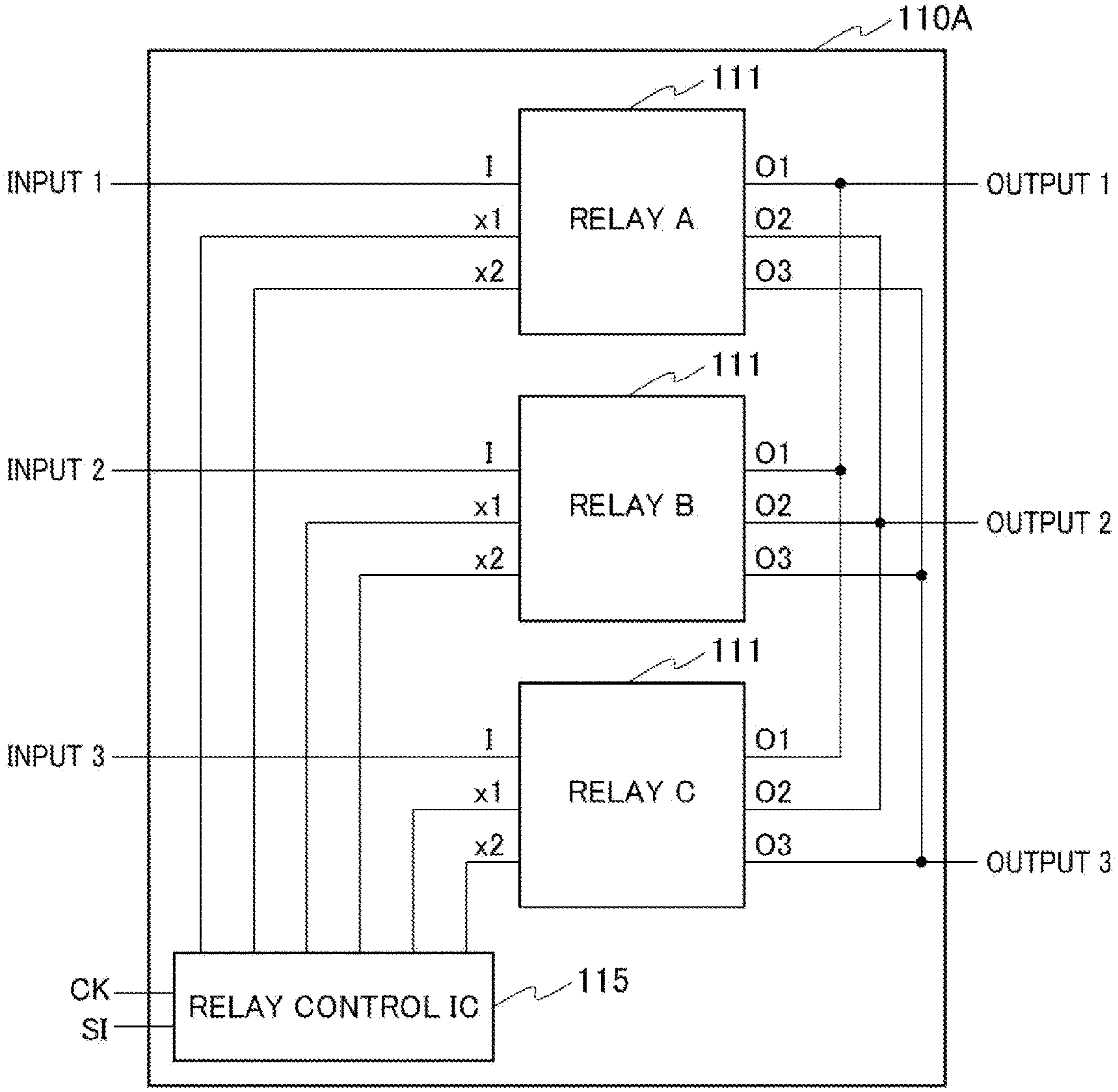
FIG. 5 is a block diagram schematically illustrating a schematic configuration example of a scramble circuit using a serial communication interface.

FIG. 5 schematically illustrates a schematic configuration example of a scramble circuit 110A using a Serial Peripheral Interface (SPI) communication which is one of synchronous serial communication interfaces. The scramble circuit 110A illustrated in FIG. 5 includes a configuration in which relay elements 111 (a relay element A, a relay element B, and a relay element C) are combined with a relay control IC 115. The SPI communication is one of clock synchronous serial communications often used for connecting devices mounted on the same substrate.

Figure 6A:
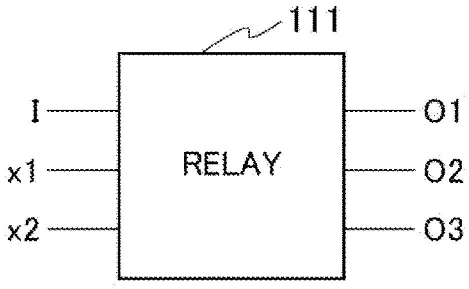
FIG. 6A is a block diagram schematically illustrating an example of input/output signals of a relay element included in the scramble circuit illustrated in FIG. 5.

Moreover, FIG. 6A schematically illustrates an example of input/output signals of the relay element 111 included in the scramble circuit 110A illustrated in FIG. 5, and FIG. 6B illustrates an example of a truth table for the relay element 111 illustrated in FIG. 6A. Moreover, FIG. 7A schematically illustrates an example of input/output signals of a relay control IC 115 included in the scramble circuit 110A illustrated in FIG. 5, and FIG. 7B illustrates an example of a timing chart of the relay control IC 115 illustrated in FIG. 7A.

In the scramble circuit 110A illustrated in FIG. 6A, the relay element 111 can select, in accordance with the truth table illustrating in FIG. 6B, whether an input signal I supplied from the burn-in apparatus 200 is provided to any one of outputs O1, O2, and O3, in accordance with two control signals x1 and x2 supplied from the relay control IC 115, or whether all outputs O1, O2, and O3 are made into high impedance (Hi-Z). For example, if the control signals x1 and x2 are both "L" (low level), the outputs O1, O2, and O3 are all set to high impedance (Hi-Z). If the control signal x1 is "L" and the control signal x2 is "H" (high level), the input signal I is provided to the output O1, and the remaining outputs O2 and O3 are set to high impedance (Hi-Z). If the control signal x1 is "H" and the control signal x2 is "L", the input signal I is provided to the output O2, and the remaining outputs O1 and O3 are set to high impedance (Hi-Z). If the control signals x1 and x2 are both "H", the input signal I is provided to the output O3, and the remaining outputs O1 and O2 are set to high impedance (Hi-Z).

The relay control IC 115 illustrated in FIG. 7 latches a value of a serial input (SI) of the SPI communication in accordance with a rise of a clock (CK) signal, and provides the latched 6-bit value correspond to outputs y1 to y6. The CK signal and the SI signal are signals to be supplied to the relay control IC 115 which is a serial communication IC, and are provided from the burn-in apparatus 200. The switching operation of the relay element 111 is realized by controlling control signals x1 to x6 (FIG. 7A) of the relay control IC 115 with the CK and SI signals.

The scramble circuit 110A illustrated in FIG. 5 controls each relay element 111 with the 6-bit value of the SI supplied into the relay control IC 115, and can freely switch and set a correspondence relationship between the inputs 1 to 3 and the outputs 1 to 3. In other words, the scramble circuit 110A controls, by the relay elements 111 and the relay control IC 115, which Input 1, Input 2, and Input 3, which are signals supplied from the burn-in apparatus 200, are to be connected to which the Output 1, Output 2, and Output 3 to the burn-in board 300.

Figure 8A:
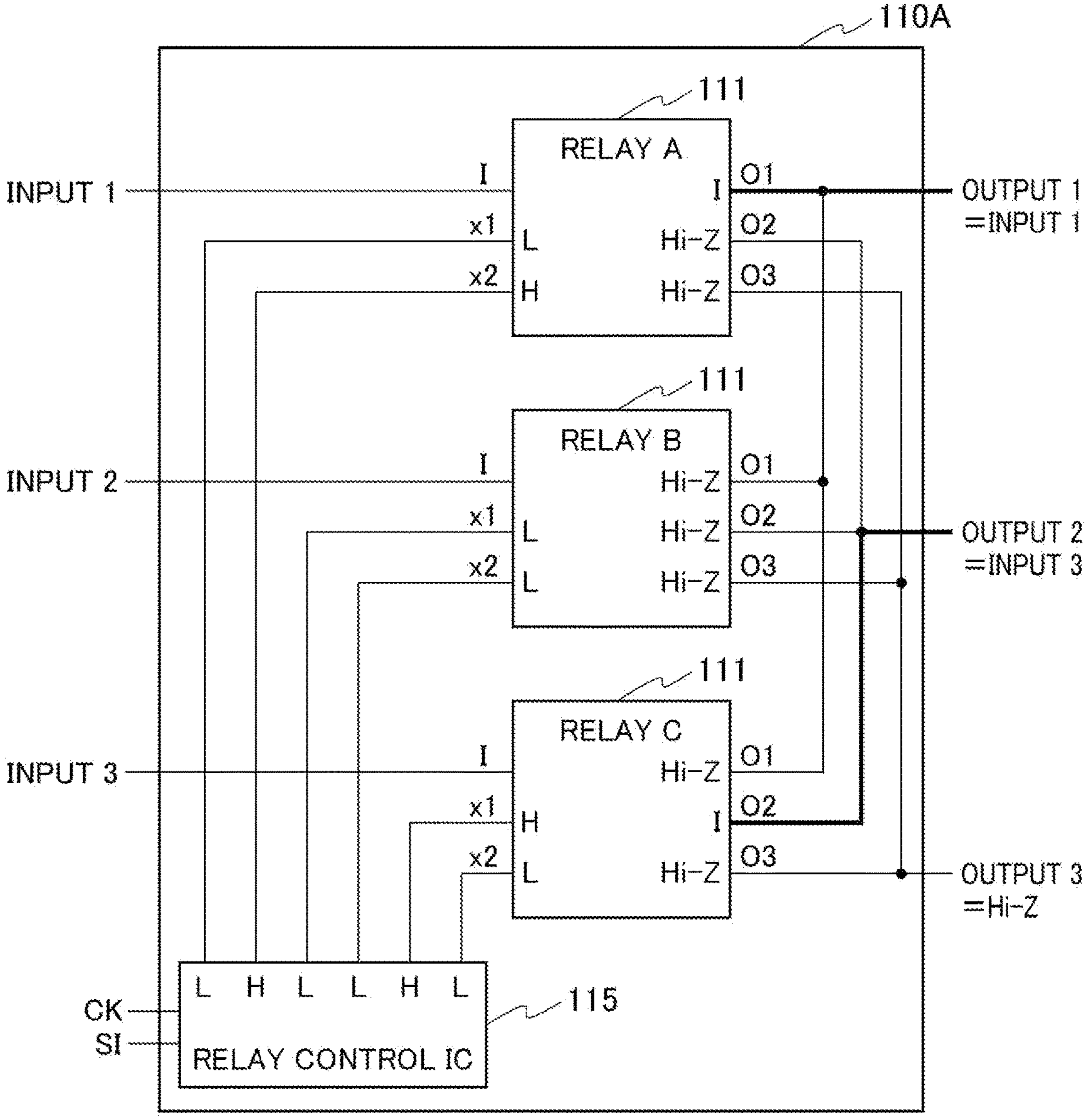
FIG. 8A is a block diagram schematically illustrating an example of input/output signals of the scramble circuit illustrated in FIG. 5.
Figure 8B:
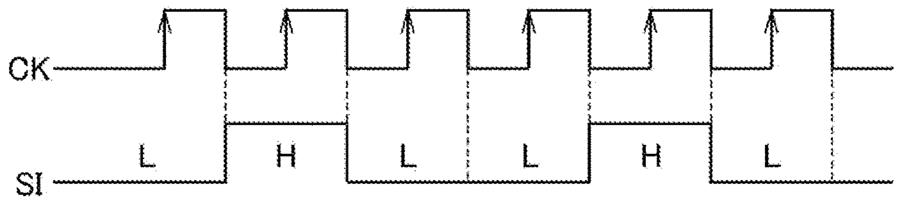
FIG. 8B is a diagram illustrating an example of a timing chart of the relay control IC provided in the scramble circuit illustrated in FIG. 8A.

FIG. 8A schematically illustrates an example of input/output signals of the scramble circuit 110A illustrated in FIG. 5, and FIG. 8B illustrates an example of an operation timing chart of the relay control IC 115 in the scramble circuit 110A illustrated in FIG. 8A. In the example illustrated in FIG. 8, the scramble circuit 110A is controlled to be Output 1=Input 1, Output 2=Input 3, and Output 3=Hi-Z, as the outputs to the burn-in board 300. More specifically, since the control signal x1 from the relay control IC 115 to the relay element A is "L" and the control signal x2 is "H", the relay element A provides the input signal I to the output O1, and sets the remaining outputs O2 and O3 to high impedance (Hi-Z). Since the control signal x1 from the relay control IC 115 to the relay element B is "L" and the control signal x2 is also "L", the relay element B sets all the outputs O1, O2, and O3 to high impedance (Hi-Z). Since the control signal x1 from the relay control IC 115 to the relay element C is "H" and the control signal x2 is "L", the relay element C provides the input signal I to the output O2, and sets the remaining outputs O1 and O3 to high impedance (Hi-Z).

In this manner, the scramble circuit 110A freely scrambles the pin assignment between Inputs 1 to 3 and Outputs 1 to 3 by the control signals x1 and x2 supplied from the burn-in apparatus 200. The relay control IC 115 freely scrambles the assignment of each pin of the input from the burn-in apparatus 200 and the output to the burn-in board 300, thereby eliminating a pin assignment mismatches between the burn-in apparatus 200 and the burn-in board 300. Thus, it is possible to prevent deterioration in test efficiency, such as fabricating a new burn-in board 300 for every pin assignment, or exchanging the burn-in boards 300 for every type of test.

Second Embodiment

Figure 10:
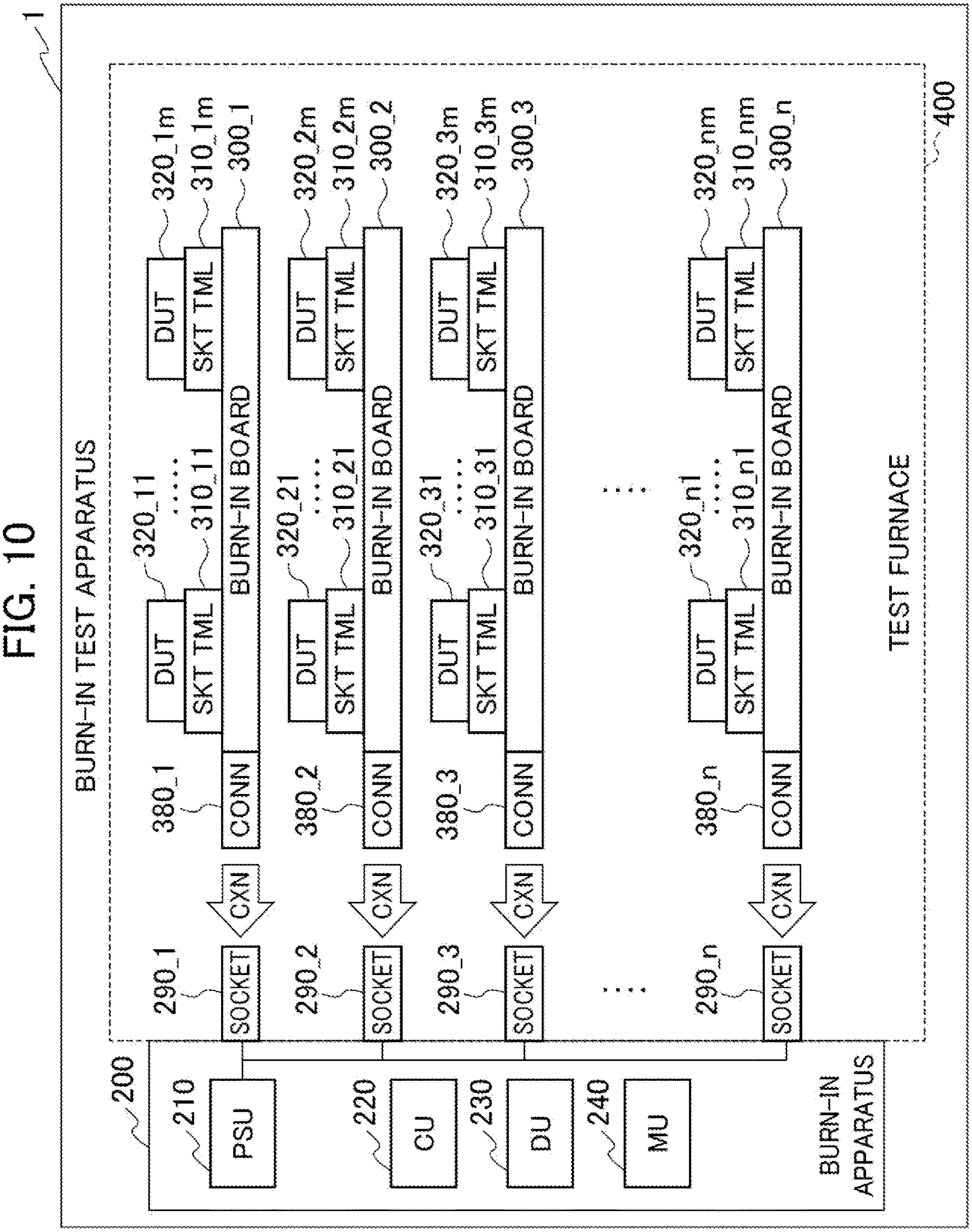
FIG. 10 is a block diagram schematically illustrating a configuration example of directly supplying power in a burn-in apparatus to a burn-in board.

In general, it is difficult to execute tests efficiently using resources (e.g., power supply resources) of burn-in apparatuses. In an environment where burn-in tests are executed, there is in general a configuration in which electric power is directly supplied to each burn-in board 300 from the power supply unit 210 in the burn-in apparatus 200 as illustrated in FIG. 10. A power supply resource which can be supplied to each DUT 320 from the power supply unit 210 in the burn-in apparatus 200 is provided with an upper limit to each of the voltage and the electric current in many cases. In contrast, semiconductor storage devices as DUTs 320 have been increasingly able to be operated with electric power supplied with lower voltages due to progress in power-saving. Therefore, in mane cases, the voltage supplied from the burn-in apparatus 200 to the DUT 320 has increasingly been afforded a margin relative to the upper limit. In contrast, an amount of current required by the DUT 320 during the burn-in test has been increasing due to sophistication and complexity of test contents. Therefore, an amount of current supplied from the burn-in apparatus 200 to the DUT 320 tends to be close to the upper limit.

Test items for the DUT 320 include an electrical conductivity test, a DC test, a functional test, an AC test, a SCAN test (structural test), a power supply-related test, and the like. If the DUT is an NAND flash memory, cell tests of the NAND memory include: a Pass/Fail test, such as SLC (1 bit/cell), MLC (2 bits/cell), TLC (3 bits/cell), and QLC (4 bits/cell); a test acceptable of a certain error as an error bit test; a fail bit count test exceeding an ECC correction capability required for the cell test as a fail bit count test; an Okay/No-Good determination test of tPROG criteria as a tPROG criteria test, and the like.

As the DUT 320 becomes increasingly low-voltage and high-current, even if there is surplus power in the total amount of power that can be supplied from the burn-in apparatus 200 to the DUT 320, the upper limit for the amount of current becomes a constraint, forcing a reduction in the number of simultaneous measurements.

(Burn-In Test Apparatus According to Second Embodiment)

Figure 9:
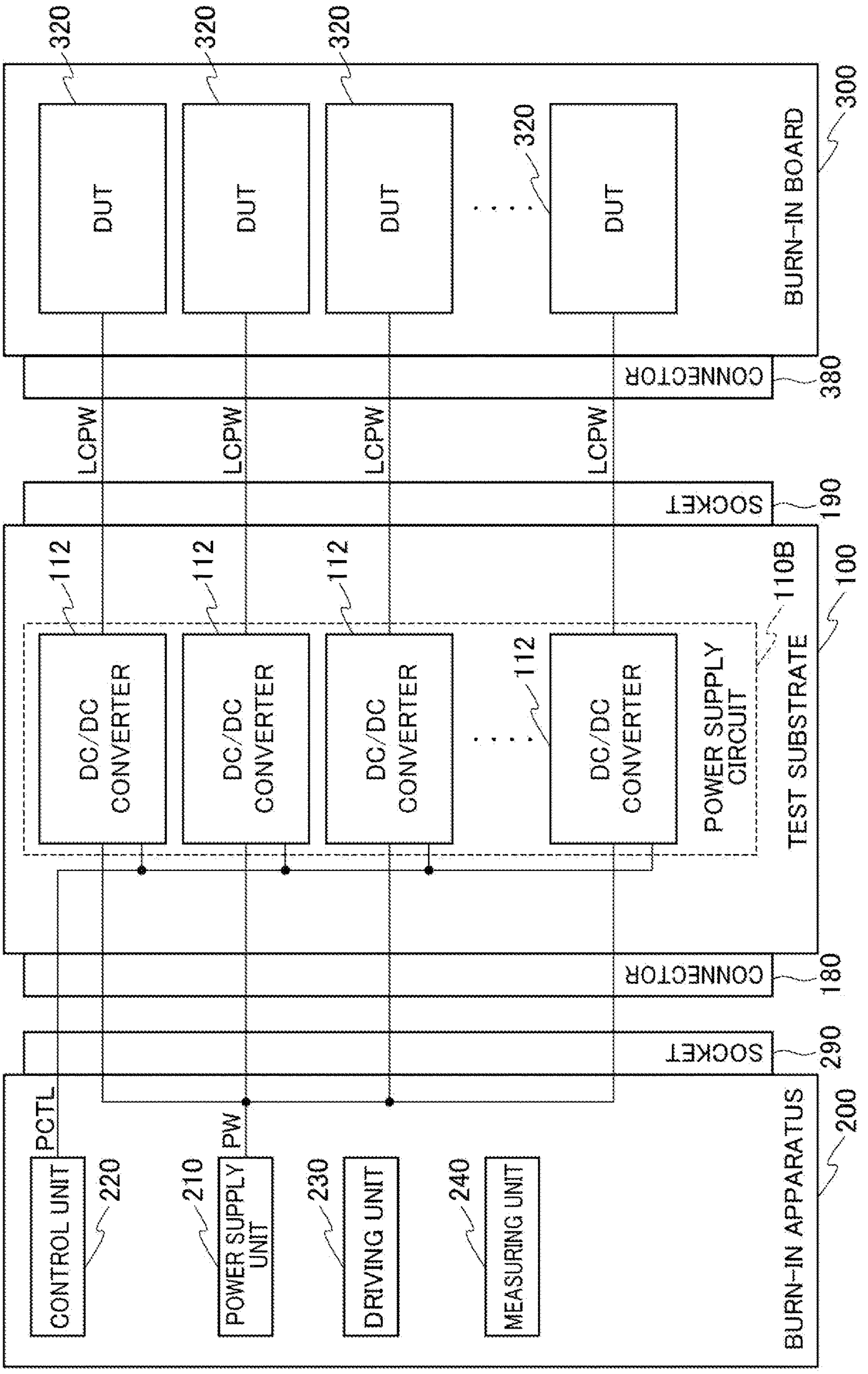
FIG. 9 is a block diagram schematically illustrating a schematic configuration example of a burn-in test apparatus according to a second embodiment.

FIG. 9 schematically illustrates a schematic configuration example of a burn-in test apparatus 1 according to a second embodiment. It is to be noted that description of parts that overlap with the components described in FIGS. 1 and 2 may be omitted.

In the burn-in test apparatus 1 according to the second embodiment, as illustrated in FIG. 9, a test substrate 100 is inserted between a burn-in apparatus 200 and a burn-in board 300, the burn-in apparatus 200 and the test substrate 100 are connected to each other, and the test substrate 100 and a burn-in board 300 are connected to each other.

The test substrate 100 includes a power supply circuit 110B disposed on the test substrate 100. The power supply circuit 110B includes a step-down DC/DC converter 112 for each burn-in board 300. A power supply voltage PW supplied from the power supply unit 210 in the burn-in apparatus 200 is supplied to each step-down DC/DC converter 112. The power supply voltage PW supplied from the burn-in apparatus 200 is stepped down by the step-down DC/DC converter 112 to a necessary and sufficient voltage region for burn-in tests and is supplied to the burn-in board 300 side.

The step-down DC/DC converter 112 is controlled by a power supply control signal PCTL supplied from the burn-in apparatus 200 side to determine whether or not the electric power is provided to the DUT 320. More specifically, when the power supply voltage is supplied to the power supply circuit 110B from the power supply unit 210 in the burn-in apparatus 200 and then the power supply control signal PCTL for instructing supply of the electric power PW from the burn-in apparatus 200 side is supplied to the power supply circuit 110B, the step-down DC/DC converter 112 steps down the power supply voltage to the necessary and sufficient voltage region for the burn-in test to be supplied to the burn-in board 300 side. After the test is completed, when the power supply control signal PCTL for instructing a supply stop of the electric power PW from the burn-in apparatus 200 side is supplied to the power supply circuit 110B, the electric power PW supplied from the step-down DC/DC converter 112 to the burn-in board 300 side is stopped.

The term "necessary and sufficient voltage region for the burn-in test" used herein is a voltage according to a specification of the semiconductor integrated circuit serving as the DUT 320, or the controller. Since the semiconductor devices in recent years have become low-voltage and high-current, the step-down DC/DC converter 112 is used to lower the voltage and allow a larger amount of electric current to flow.

The power supply voltage stepped down within a range of the amount of power supplied from the power supply unit 210 in the burn-in apparatus 200 is amplified in current to be supplied to the burn-in board 300 side. As a specific example, when power of 20V voltage and 5 A current is supplied to the step-down DC/DC converter 112 from a 100 W power supply, if assuming that the power is stepped down with 100% efficiency without power loss, 100 W power is maintained, such as 10V voltage and 10 A current, and the voltage is dropped and the current is amplified to be provided. Thus, by utilizing the step-down DC/DC converter 112 an amount of the current exceeding the upper limit of the specification at the side of the burn-in apparatus 200 can be supplied to the burn-in board 300 side. Consequently, in the burn-in test, even if a larger current needs to be supplied to the DUT 320, it is possible to supply to the DUT 320 a large current exceeding the upper limit of the amount of current which can be supplied by the burn-in apparatus 200 by stepping down the voltage. Therefore, the number of simultaneous measurements of the DUTs 320 can be expanded within a range of the maximum power supply capacity, without being bound by the upper limit specification of the current at the side of the burn-in apparatus 200.

(Burn-In Test Apparatus According to Modified Embodiment of Second Embodiment)

Figure 11:
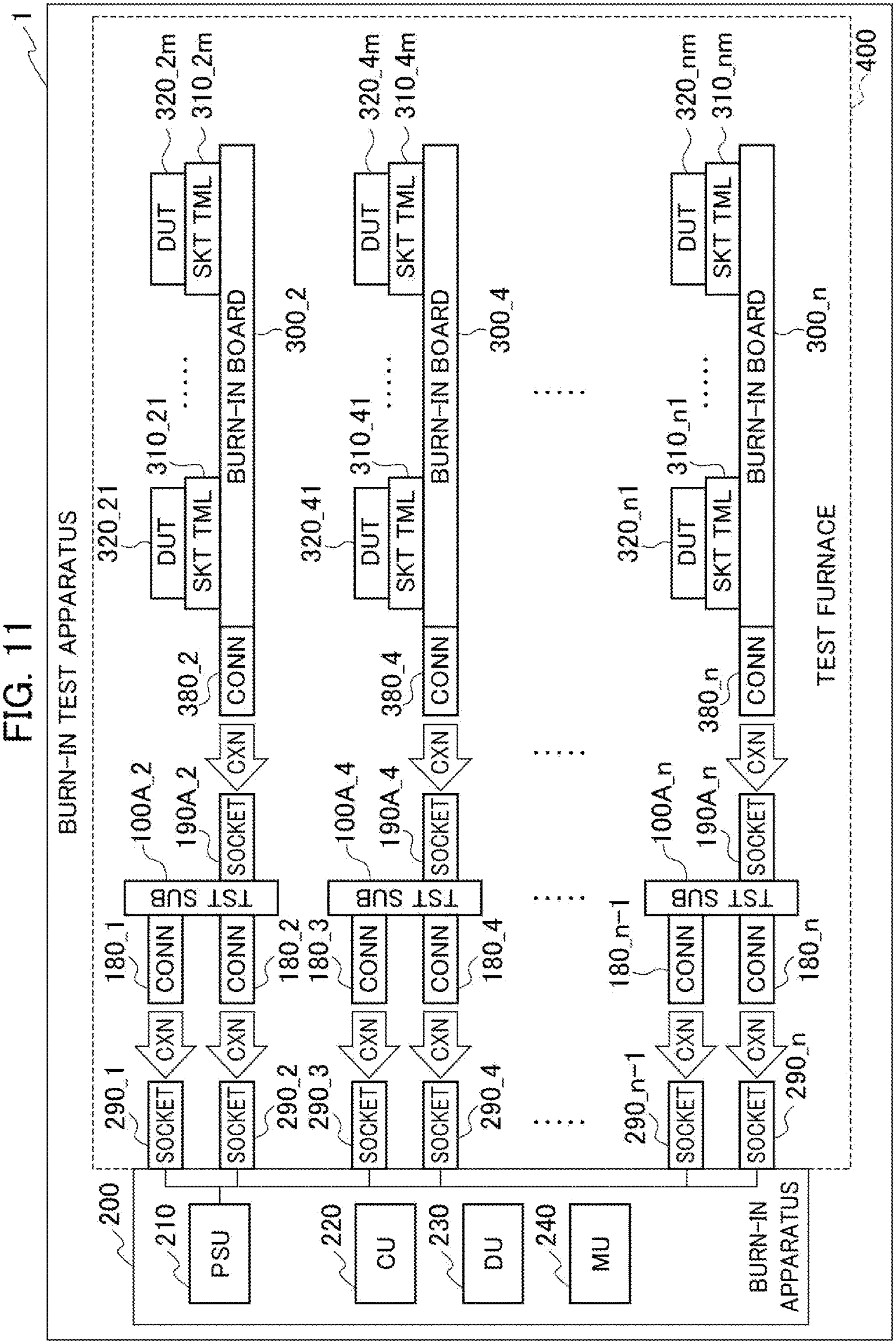
FIG. 11 is a block diagram schematically illustrating a schematic configuration example of a burn-in test apparatus according to a modified embodiment of the second embodiment.
Figure 12:
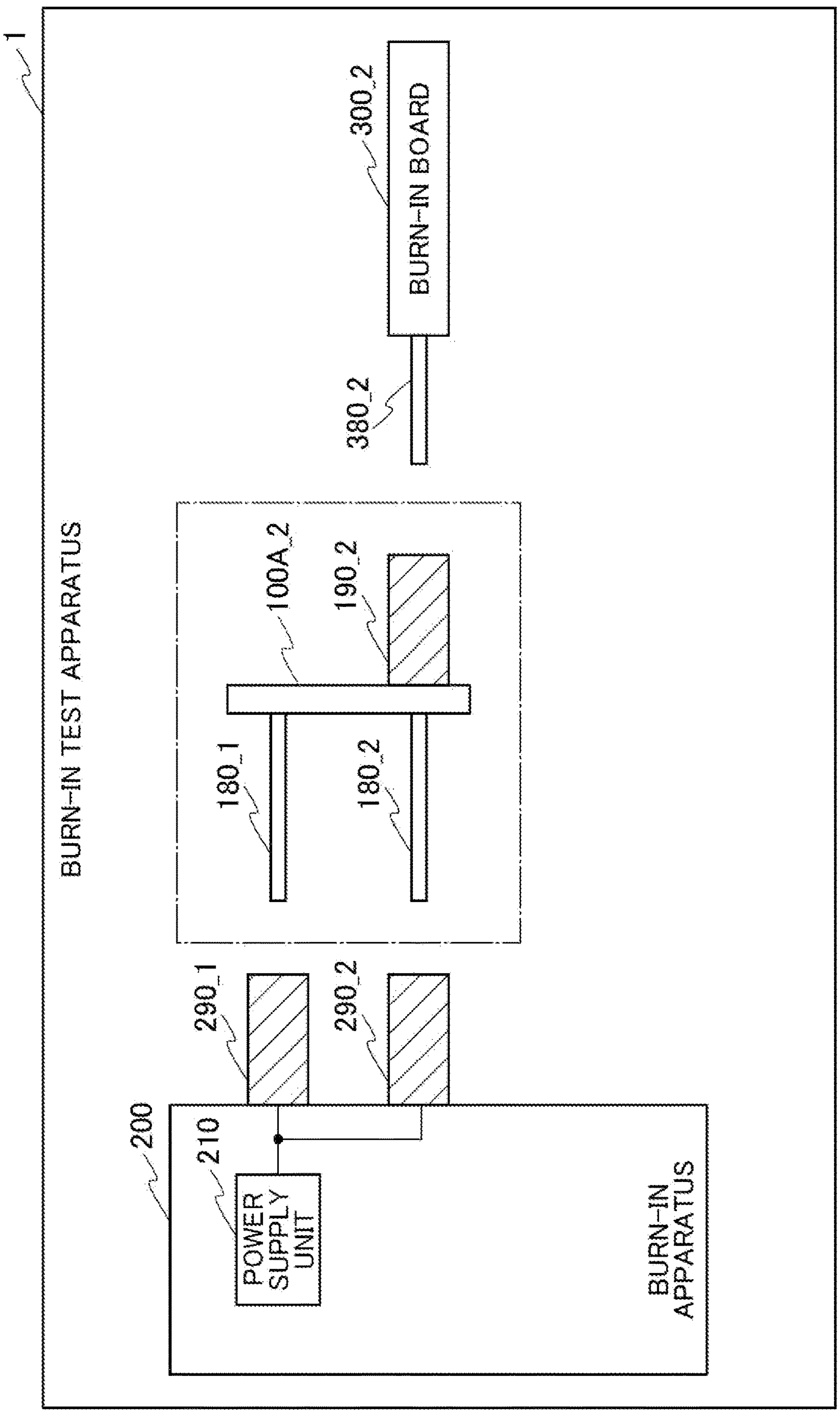
FIG. 12 is a block diagram schematically illustrating a connecting configuration example of the burn-in test apparatus illustrated in FIG. 11.

FIG. 11 schematically illustrates a schematic configuration example of a burn-in test apparatus 1 according to a modified embodiment of the second embodiment, and FIG. 12 schematically illustrates a connecting configuration example of the burn-in test apparatus 1 illustrated in FIG. 11.

In the burn-in test apparatus 1 according to the second embodiment illustrated in FIG. 9, the step-down DC/DC converter 112 is provided for each burn-in board 300 and the power is supplied from one power supply resource to one burn-in board 300.

In contrast, the burn-in test apparatus 1 according to the modified embodiment of the second embodiment includes a test substrate 100A capable of supplying power supply resources of a plurality of slots to one burn-in board 300.

More specifically, as illustrated in FIG. 12, focusing on the burn-in board 300_2, a test substrate 100A_2 includes two edge connectors 180_1 and 180_2. The edge connector 180_1 is connected to and inserted into an edge connector socket 290_1 in the burn-in apparatus 200, and the edge connector 180_2 is connected to and inserted into an edge connector socket 290_2 in the burn-in apparatus 200. Moreover, the burn-in board 300_2 is connected to and inserted into the edge connector socket 190_2 of the test substrate 100A_2. The same applies to the burn-in board 300_4 and the burn-in board 300_*n* illustrated in FIG. 11.

In an example illustrated in FIG. 12, power for two burn-in boards 300 can be supplied to one burn-in board 300_2. Such a configuration is particularly useful when the maximum power supply capacity to one burn-in board is insufficient.

It is to be noted that FIG. 11 and FIG. 12 illustrate the configuration example of supplying the power supply resources of two slots to one burn-in board 300, but it is not limited to such a configuration, power supply resources of three or more slots may be supplied to one burn-in board 300, as required.

Moreover, the power supply circuit 110B including the step-down DC/DC converter 112 as illustrated in FIG. 9 can also be mounted on the test substrate 100A in the modified embodiment of the second embodiment, and thereby the step-down DC/DC converter 112 in the power supply circuit 110B can step down the power supply voltage to the necessary and sufficient voltage region for the burn-in test to be supplied to the burn-in board 300 side.

Third Embodiment

Since the burn-in test is executed under a predetermined temperature, it needs to house all DUTs 320 in the test furnace (chamber) 400. Therefore, as the number of simultaneous measurements of the DUTs 320 increases, environmental variations in the test furnace 400, especially the temperature variations in the test furnace 400, increase. In order to improve test efficiency, it is effective to increase the number of simultaneous measurements. However, as the number of DUTs 320 to be operated simultaneously increases, the temperature in the test furnace 400 rises due to heat generated by the DUTs 320 themselves.

Figure 13:
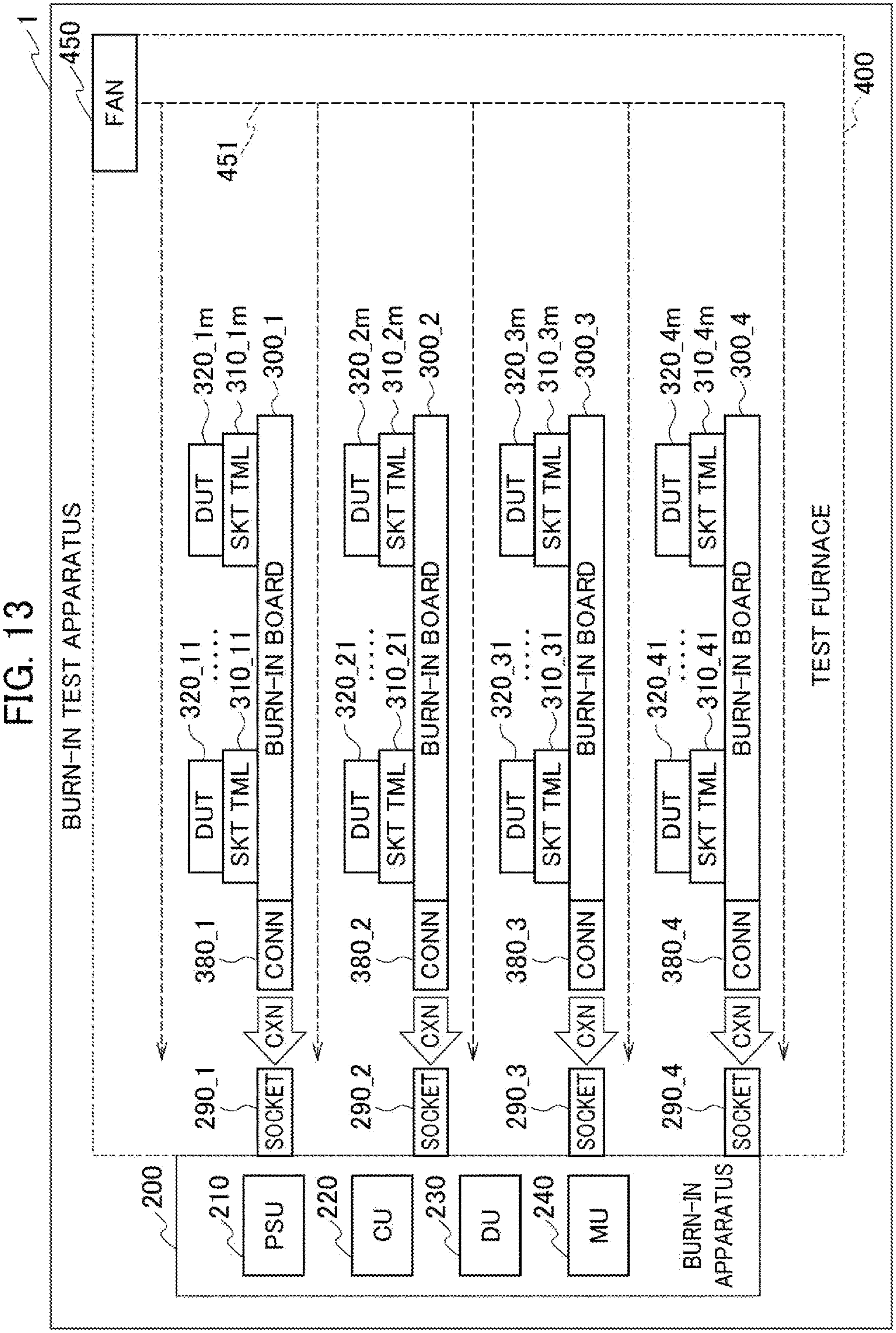
FIG. 13 is a diagram schematically illustrating a relationship example between positions of burn-in boards inserted in a test furnace and an airflow from a fan.

As illustrated in FIG. 13, the burn-in test apparatus 1 includes a fan 450 configured to supply an airflow 451 in order to maintain the temperature inside the test furnace 400 constant. As factors causing a temperature variation inside the test furnace 400, in an example illustrated in FIG. 13, the airflow 451 passes differently depending on positions of the burn-in boards 300, the airflow 451 is weaker around the burn-in boards 300_4 far from the fan 450 than around the burn-in boards 300_1 near the fan 450, and therefore it is more difficult to decrease the temperature around the burn-in boards 300_4. Moreover, even on the same burn-in board 300_1, it is difficult to lower the temperature of the DUT 320_11 at a leeward side, since the airflow 451 is heated by the heat generated by the DUT 320_1*m* at a windward side heat. Furthermore, as the number of simultaneous measurements is increased, more heat is generated, resulting in greater temperature variation in the test furnace 400.

(Burn-In Test Apparatus According to Third Embodiment)

Figure 14:
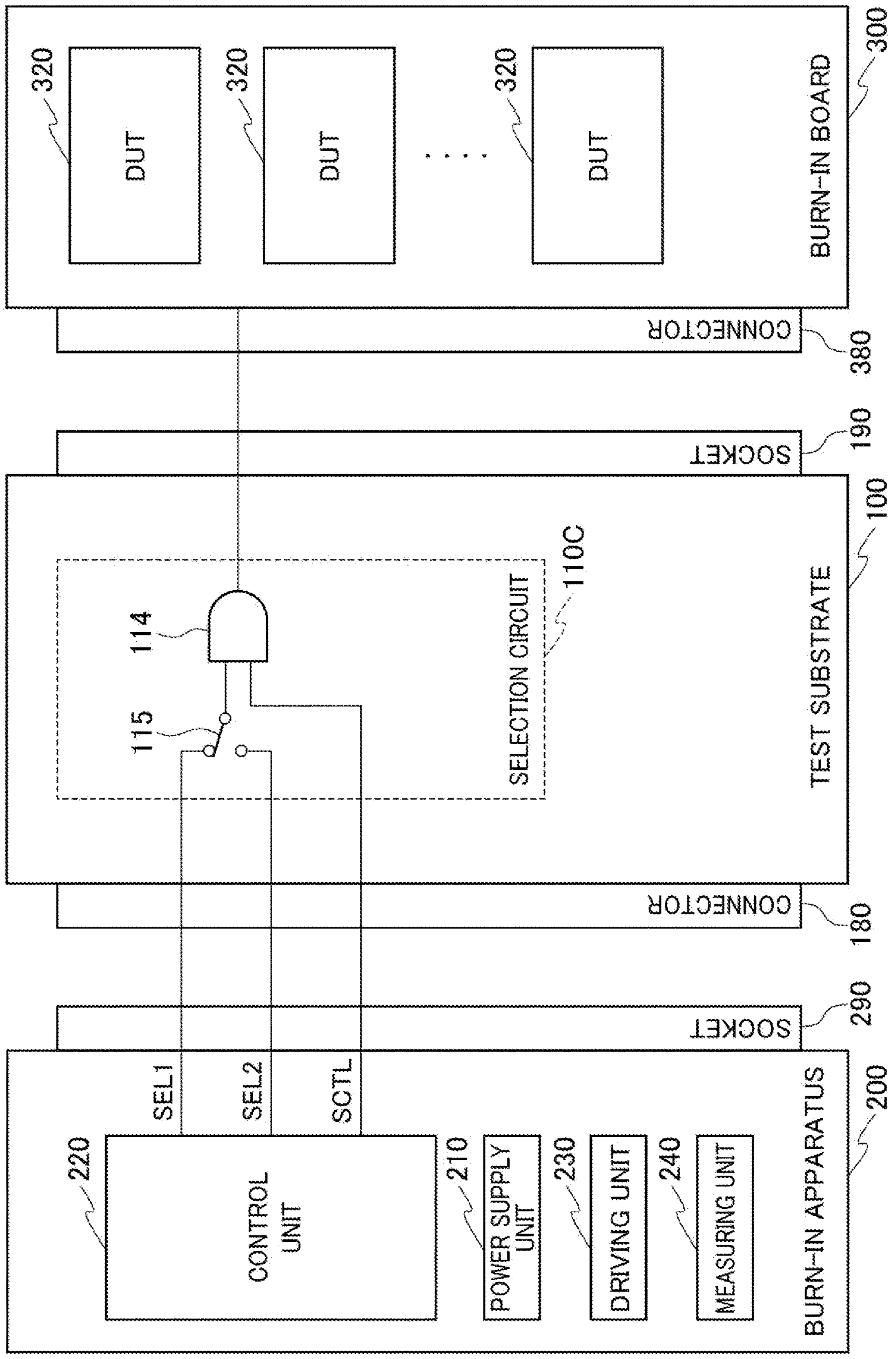
FIG. 14 is a block diagram schematically illustrating a schematic configuration example of a burn-in test apparatus according to a third embodiment.

FIG. 14 schematically illustrates a schematic configuration example of a burn-in test apparatus 1 according to a third embodiment.

As illustrated in FIG. 14, in the burn-in test apparatus 1 according to the third embodiment, a test substrate 100 is inserted between a burn-in apparatus 200 which provides test signals to DUTs 320 and a burn-in board 300 on which the DUTs 320 are mounted, the burn-in apparatus 200 and the test substrate 100 are connected to each other, and the test substrate 100 and the burn-in board 300 are also connected to each other. On the test substrate 100, a selection circuit 110C for dividing the burn-in boards 300 into a plurality of groups (switching circuit configured to mask the signals supplied from the burn-in apparatus 200 to the burn-in board 300 and to switch the signals for each burn-in board 300) is mounted, and by supplying selection signals (enable signals) SEL1 and SEL2 for respective groups from the burn-in apparatus 200 and a selection control signal SCTL to the selection circuit 110C, the burn-in boards 300 that operate simultaneously are controlled to be selected to suppress temperature variations inside the test furnace 400. For example, the selection signal SEL1 is a selection signal corresponding to Group 1, and the selection signal SEL2 is a selection signal corresponding to Group 2.

The selection circuit 110C includes a switch 115 and an AND gate 114. The selection signals SEL1 and SEL2 prepared for respective groups are supplied from the burn-in apparatus 200 to the selection circuit 110C on the test substrate 100. The switch 115 selects the selection signal SEL1 or SEL2 to be used, and the AND gate 114 masks the control signal SCTL to be provided to the burn-in board according to the selection signal SELL or SEL2 which is selected. Consequently, the control signal for each group (Group 1, 2) according to a state of the selection signal SEL1 or SEL2 which is selected is provided to the burn-in board 300 side.

(Burn-In Test Apparatus According to Modified Embodiment of Third Embodiment)

Figure 15:
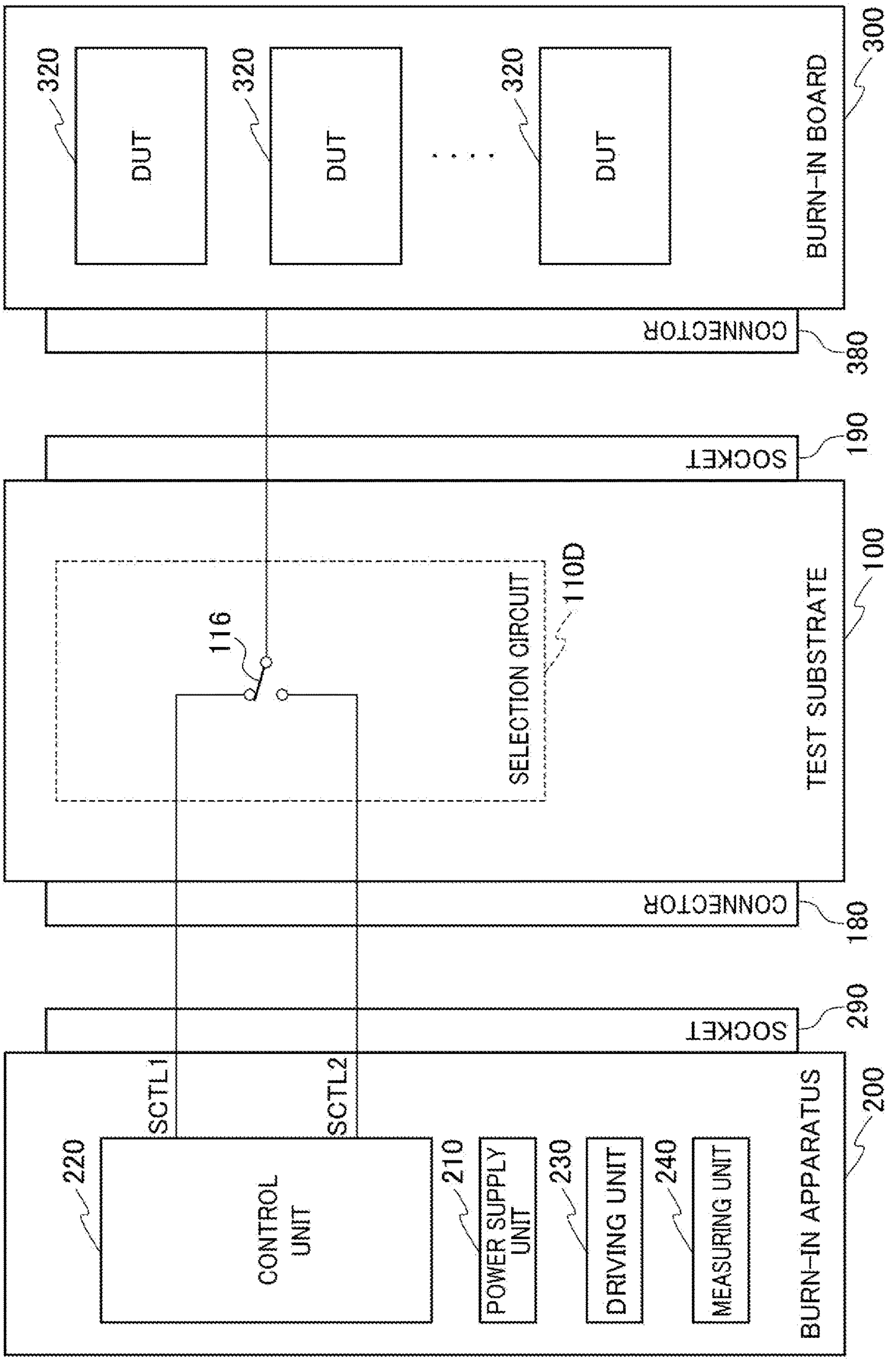
FIG. 15 is a block diagram schematically illustrating a schematic configuration example of a burn-in test apparatus according to a modified embodiment of the third embodiment.

FIG. 15 schematically illustrates a schematic configuration example of a burn-in test apparatus 1 according to a modified embodiment of the third embodiment.

As illustrated in FIG. 15, in the burn-in test apparatus 1 according to the modified embodiment of the third embodiment, a test substrate 100 is inserted between a burn-in apparatus 200 and a burn-in board 300, the burn-in apparatus 200 and the test substrate 100 are connected to each other, and the test substrate 100 and the burn-in board 300 are also connected to each other. On the test substrate 100, a selection circuit 110D for grouping the burn-in boards 300 into a plurality of groups (switch circuit configured to a select signal supplied from the burn-in apparatus 200 to the burn-in board 300) is mounted. The selection circuit 110D includes a switch 116. Moreover, the selection control signal SCTL1 and SCTL2 are prepared for the respective groups, and the burn-in boards 300 are divided into a plurality of groups by the switch 116 selects the selection control signal SCTL1 or SCTL2 supplied from the burn-in apparatus 200. For example, the selection control signal SCTL1 is a control signal corresponding to Group 1, and the selection control signal SCTL2 is a control signal corresponding to Group 2.

More specifically, in order to change a timing of the selection control signal (SCTL1, SCTL2) for each burn-in board 300, the selection control signal (SCTL1, SCTL2) of each group having the changed timing is provided from the burn-in test apparatus. The selection circuit 110D on the test substrate 100 selects the selection control signal (SCTL1, SCTL2) for each group and provides the selected selection control signal (SCTL1, SCTL2) for the group to the burn-in board 300, and thereby grouping control of the burn-in boards to be operated simultaneously can be realized.

Figure 16:
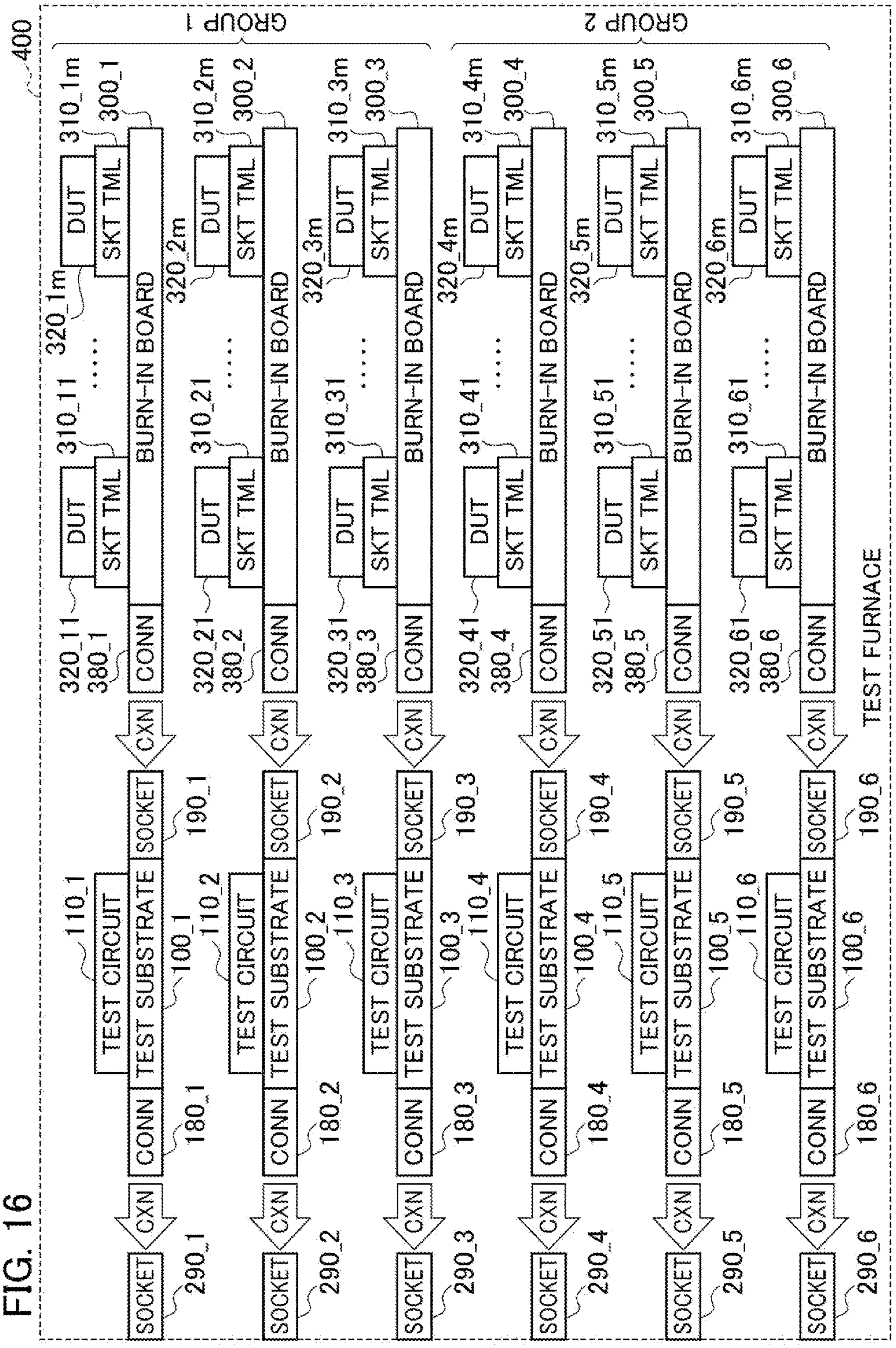
FIG. 16 is a block diagram schematically illustrating an example of a grouping of burn-in boards executed by the burn-in test apparatus illustrated in FIG. 14 or 15.

FIG. 16 illustrates an example of burn-in boards grouped by the burn-in test apparatus 1 according to the third embodiment or the burn-in test apparatus 1 according to the modified embodiment of the third embodiment. As illustrated in FIG. 16, the burn-in boards 300_1, 300_2, and 300_3 are grouped into Group 1, and the burn-in boards 300_4, 300_5, and 300_6 are grouped into Group 2.

Figure 17:
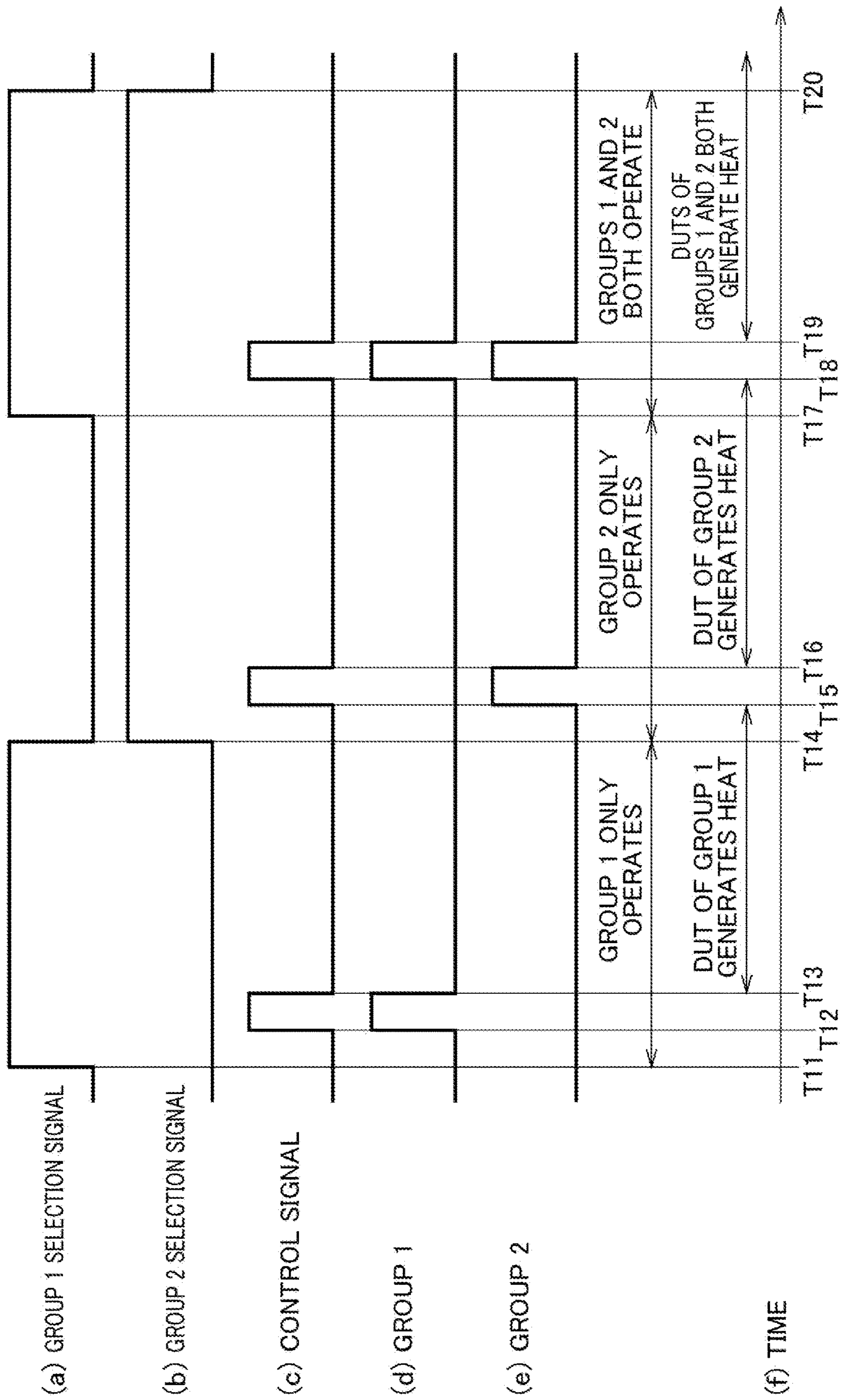
FIG. 17 is a diagram schematically illustrating an example of an output waveform when the grouping of the burn-in boards are executed by the burn-in test apparatus illustrated in FIG. 14.

FIG. 17 illustrates an example of an output waveform when burn-in boards 300 are grouped by the burn-in test apparatus 1 illustrated in FIG. 14. FIG. 17 illustrates an output waveform in the case of grouping the burn-in boards 300 into two groups.

At time T11, when a selection signal SEL1 for Group 1 is supplied to test substrates 100 from the burn-in apparatus 200, an operable period of the burn-in boards 300 (300_1, 300_2, 300_3 in the example of FIG. 16) belonging to Group 1 are started.

At time T12, when a control signal SCTL is supplied to the test substrates 100 from the burn-in apparatus 200, the selection circuit 110C supplies a control signal for Group 1 to the burn-in boards 300 belonging to Group 1. At time T13, DUTs 320 mounted on the burn-in boards 300 belonging to Group 1 starts to execute an operation, and the DUTs 320 concerned also starts to generate heat.

At time T14, when the selection signal SEL2 for group 2 is supplied to the test substrates 100 from the burn-in apparatus 200, an operable period of the burn-in boards 300 (300_4, 300_5, 300_6 in the example of FIG. 16) belonging to group 2 is started.

At time T15, when the control signal SCTL is supplied to the test substrates 100 from the burn-in apparatus 200, the selection circuit 110C supplies the control signal for Group 2 to the burn-in boards 300 belonging to Group 2. At time T16, the DUTs 320 mounted on the burn-in boards 300 belonging to Group 2 starts to execute an operation, and the DUTs 320 concerned also starts to generate heat.

Thereafter, the switching between Group 1 and Group 2 can be executed in the same manner.

It is to be noted that, in a test with little heat generation, it is possible to simultaneously operate a plurality of groups by controlling the outputs of the selection signals SEL1 and SEL2 from the burn-in apparatus 200 side.

Figure 18:
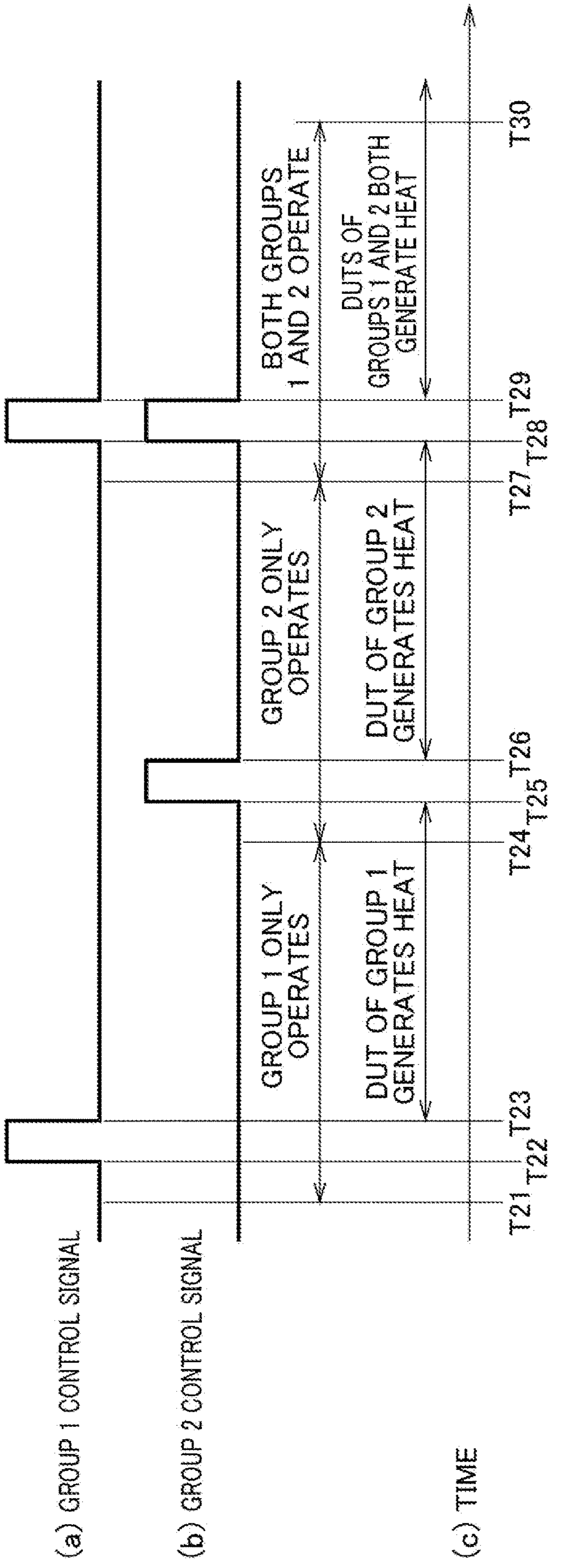
FIG. 18 is a diagram schematically illustrating an example of an output waveform when the grouping of the burn-in boards are executed by the burn-in test apparatus illustrated in FIG. 15.

FIG. 18 illustrates an example of an output waveform when burn-in boards 300 are grouped by the burn-in test apparatus 1 illustrated in FIG. 15. FIG. 18 illustrates an output waveform in the case of grouping the burn-in boards 300 into two groups.

During an operable period of the burn-in boards 300 (300_1, 300_2, 300_3 in the example of FIG. 16) belonging to Group 1 starting at time T21, at time T22, when a control signal SCTL1 for Group 1 is supplied to the test substrates 100 from the burn-in apparatus 200, the selection circuit 110D supplies a control signal SCTL1 for Group 1 to the burn-in boards 300 belonging to Group 1. Moreover, at time T23, DUTs 320 mounted on the burn-in boards 300 belonging to Group 1 starts to execute an operation, and the DUTs 320 concerned also starts to generate heat.

During an operable period of the burn-in boards 300 (300_4, 300_5, 300_6 in the example of FIG. 16) belonging to Group 2 starting at time T24, at time T25, when the control signal SCTL2 for Group 2 is supplied to the test substrates 100 from the burn-in apparatus 200, the selection circuit 110D supplies the control signal SCTL1 for Group 2 to the burn-in boards 300 belonging to Group 2. Moreover, at time T26, DUTs 320 mounted on the burn-in boards 300 belonging to Group 1 starts to execute an operation, and the DUTs 320 concerned also starts to generate heat.

Thereafter, the switching between Group 1 and Group 2 can be executed in the same manner.

It is to be noted that, in a test with little heat generation, it is possible to simultaneously operate a plurality of groups by controlling the outputs of the selection signals SEL1 and SEL2 from the burn-in apparatus 200 side.

It is to be noted that the processing operations in the timing charts illustrated to FIGS. 17 and 18 can also be described in a computer program as instructions to be executed by computers. The computer program is stored in, for example, a non-transitory computer readable medium and is used for the diagnostic system according to the embodiments.

(Connection Example of Test Substrate in Embodiments)

The first to third embodiments have illustrated an example in which the single test substrate 100 is connected to and inserted into between the burn-in apparatus 200 and the burn-in board 300, and a plurality of types of test substrates 100 can also be connected and inserted in series between the burn-in apparatus 200 and the burn-in board 300.

Figure 19:
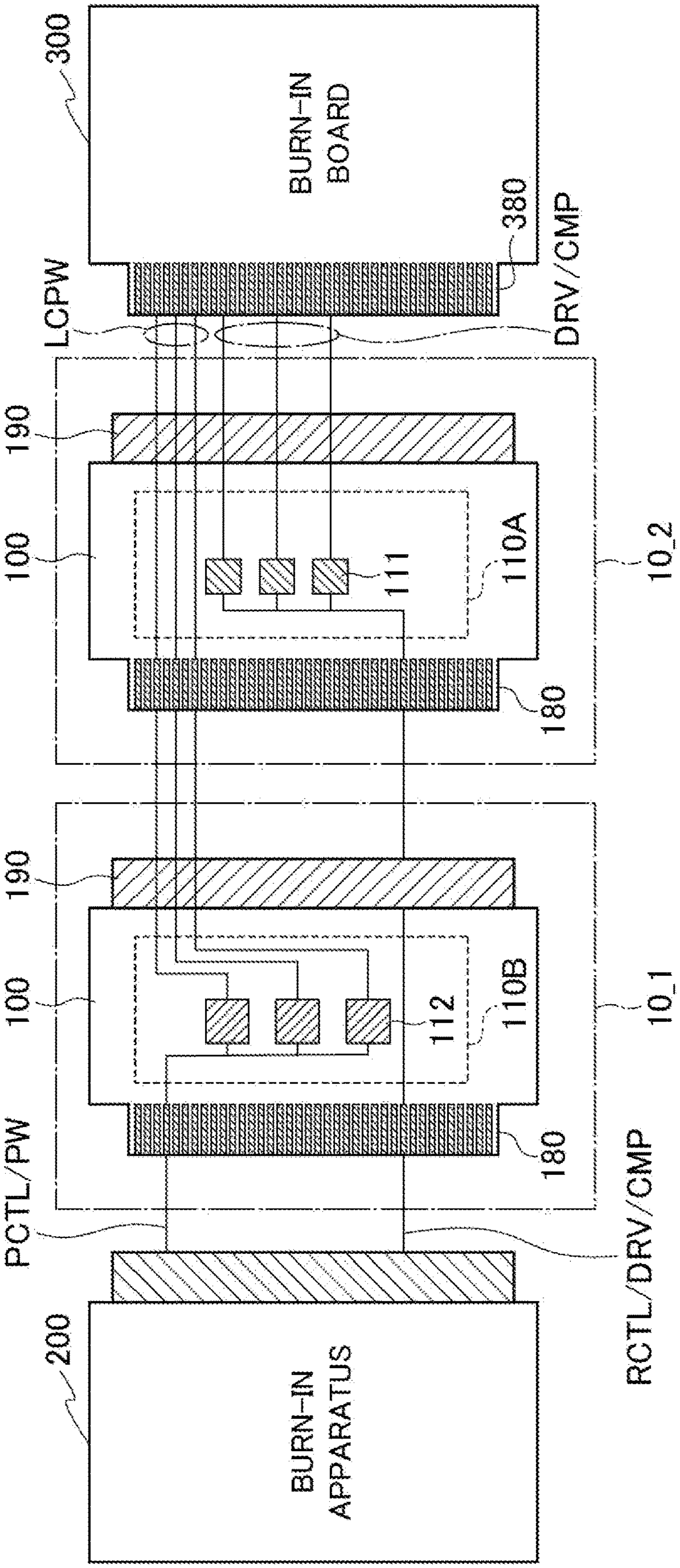
FIG. 19 is a diagram schematically illustrating a connection example of a configuration of connecting a plurality of test substrates in series in a burn-in test apparatus according to the embodiments.
Figure 20:
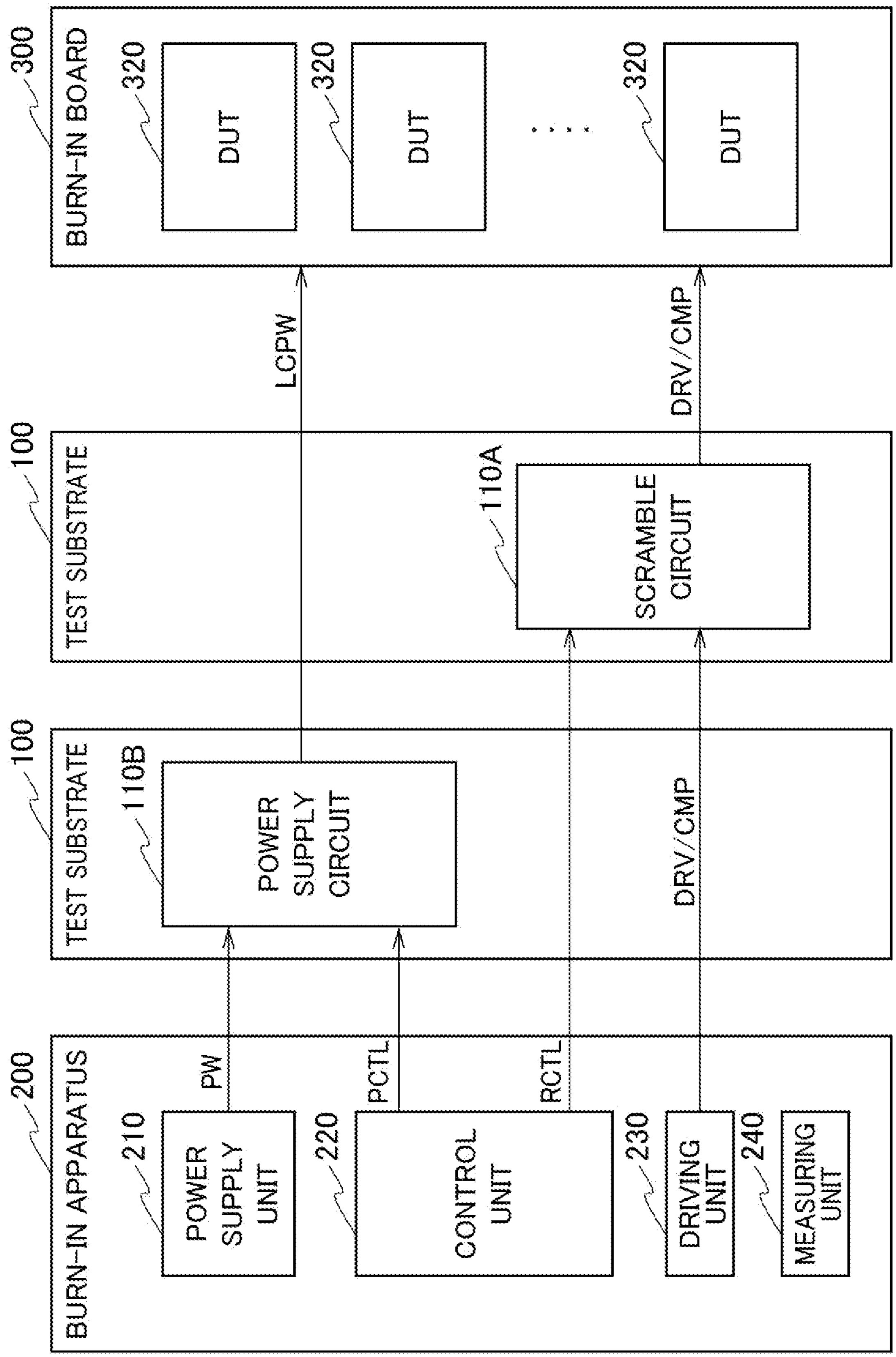
FIG. 20 is a block diagram schematically illustrating an example of a configuration of connecting a plurality of test substrates in series in the burn-in test apparatus according to the embodiments.

FIG. 19 schematically illustrates a connection example of a configuration in which a plurality of test substrates 100 are connected in series, in the burn-in test apparatus 1 according to the embodiments, and FIG. 20 is a block diagram schematically illustrating the configuration example thereof.

A test substrate 100 on which a power supply circuit 110B is mounted (i.e., power supply circuit mounting substrate 10_1), and a test substrate 100 on which a scramble circuit 110A is mounted (i.e., scramble circuit mounting substrate 10_2) are connected and inserted in series between the burn-in apparatus 200 and the burn-in board 300.

In FIG. 19, a power supply control signal PCTL and a power supply voltage PW supplied from the burn-in apparatus 200 are provided to the power supply circuit mounting substrate 10_1, in which the power supply voltage are subjected to a DC/DC conversion to be a predetermined voltage and an amount of current by the power supply circuit 110B in the power supply circuit mounting substrate 10_1, and pass through the scramble circuit mounting substrate 10_2 and are supplied to the burn-in board 300. On the other hand, a relay control signal RCTL and signals DRV and CMP supplied the from burn-in apparatus 200 pass through the power supply circuit mounting substrate 10_1 and are supplied to the scramble circuit 110A in the scramble circuit mounting substrate 10_2. Then, a pin assignment is switched in the scramble circuit 110A and the signals are supplied to the burn-in board 300.

It is to be noted that, in the example illustrated in FIG. 19, the power supply circuit mounting substrate 10_1 is connected to the side near the burn-in apparatus 200 and the scramble circuit mounting substrate 10_2 is connected to the side near the burn-in board 300, but the arrangement of the power supply circuit mounting substrate 10_1 and the arrangement of the scramble circuit mounting substrate 10_2 can be reversed.

Hereinafter, examples of connecting and inserting a plurality of types of test substrates 100 in series will now be illustrated.

Figure 21:
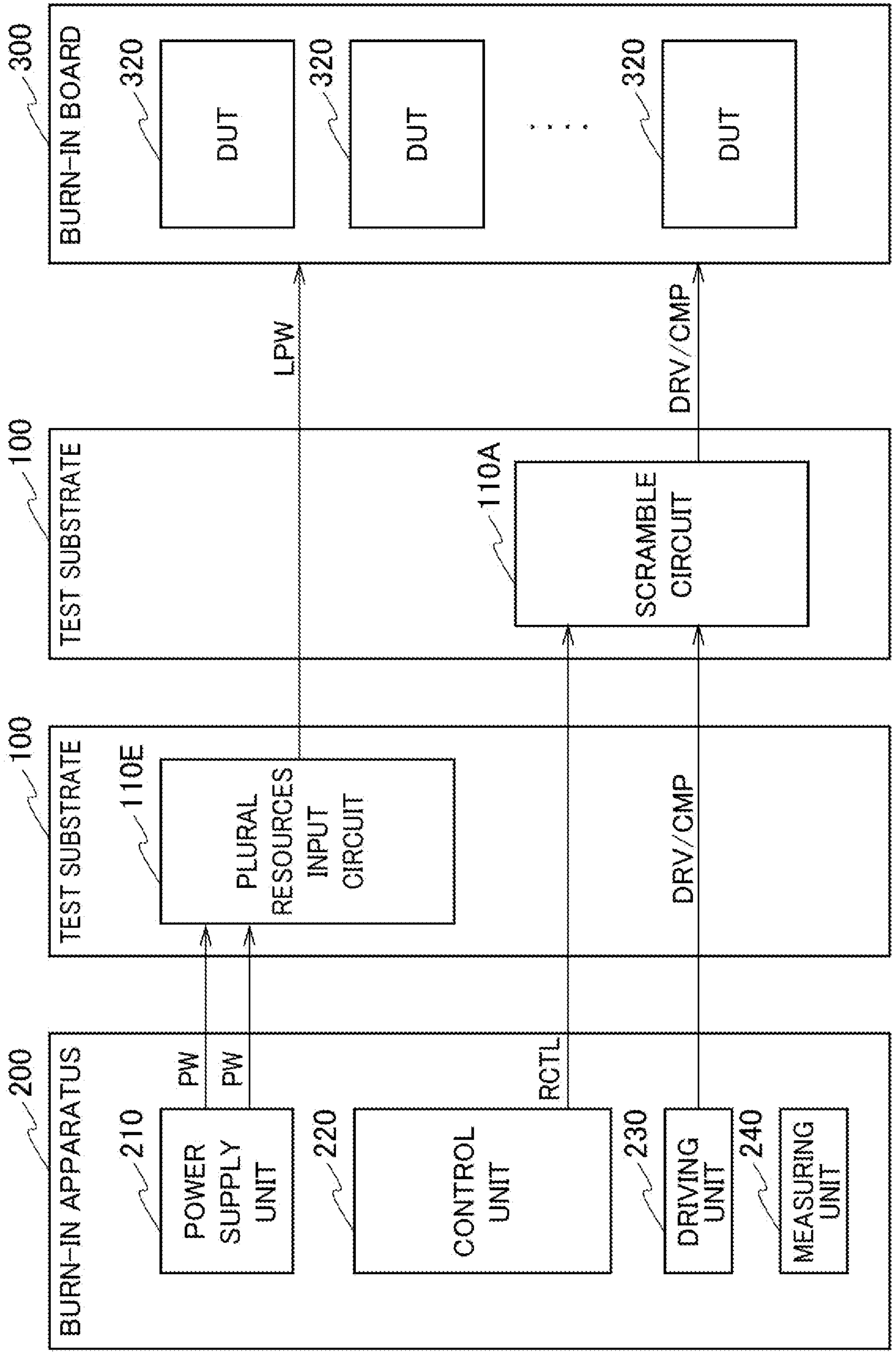
FIG. 21 is a block diagram schematically illustrating another example of a configuration of connecting a plurality of test substrates in series in the burn-in test apparatus according to the embodiments.

In FIG. 21, the test substrate 100 (i.e., input circuit for plurality of resources 110E) according to the modified embodiment of the second embodiment illustrated in FIG. 11 and the test substrate 100 on which the scramble circuit 110A is mounted are connected and inserted in series between the burn-in apparatus 200 and the burn-in board 300.

Figure 22:
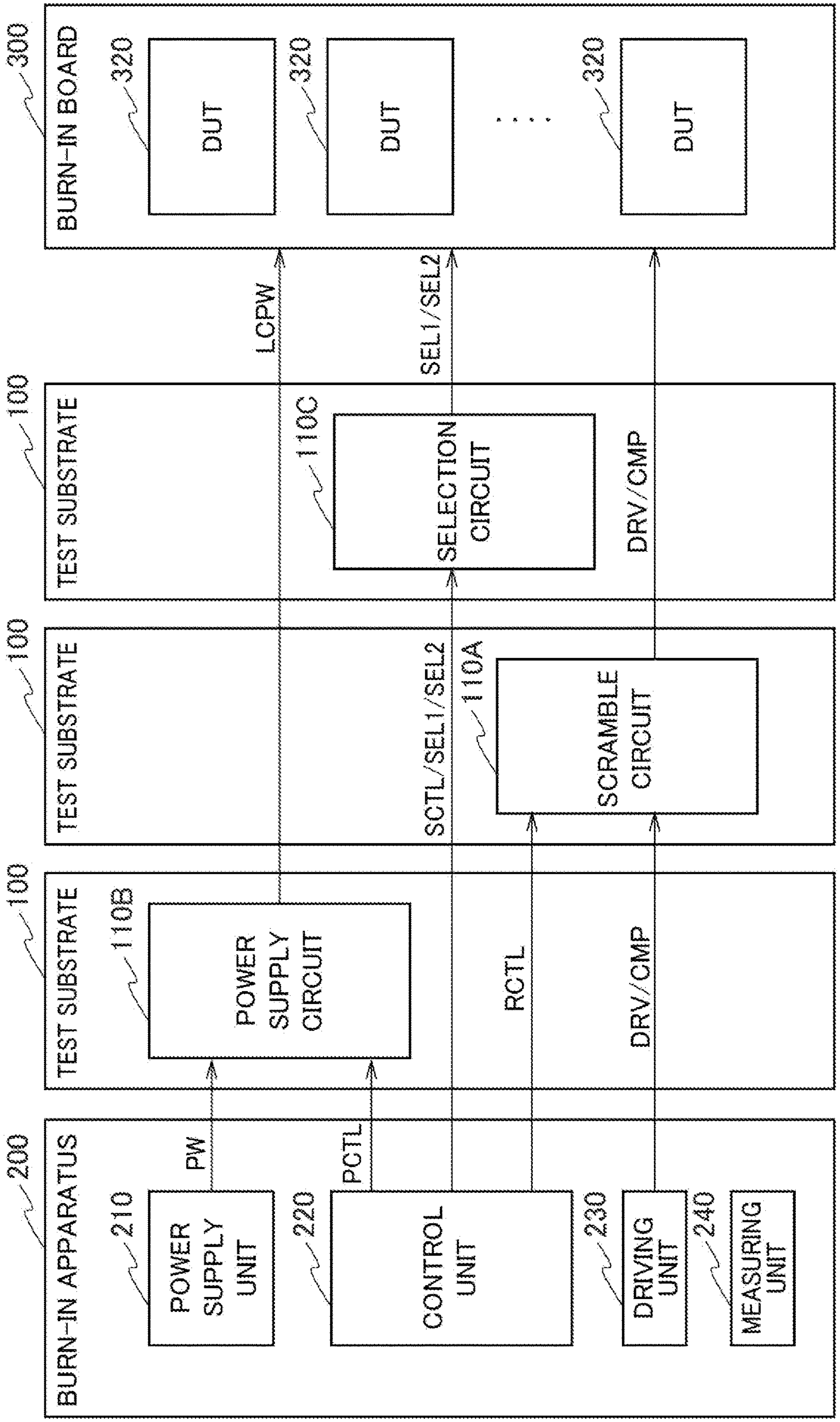
FIG. 22 is a block diagram schematically illustrating still another example of a configuration of connecting a plurality of test substrates in series in the burn-in test apparatus according to the embodiments.

In FIG. 22, the test substrate 100 on which the power supply circuit 110B is mounted, the test substrate 100 on which the scramble circuit 110A is mounted, and the test substrate 100 on which the selection circuit 110C is mounted are connected and inserted in series between the burn-in apparatus 200 and the burn-in board 300.

Figure 23:
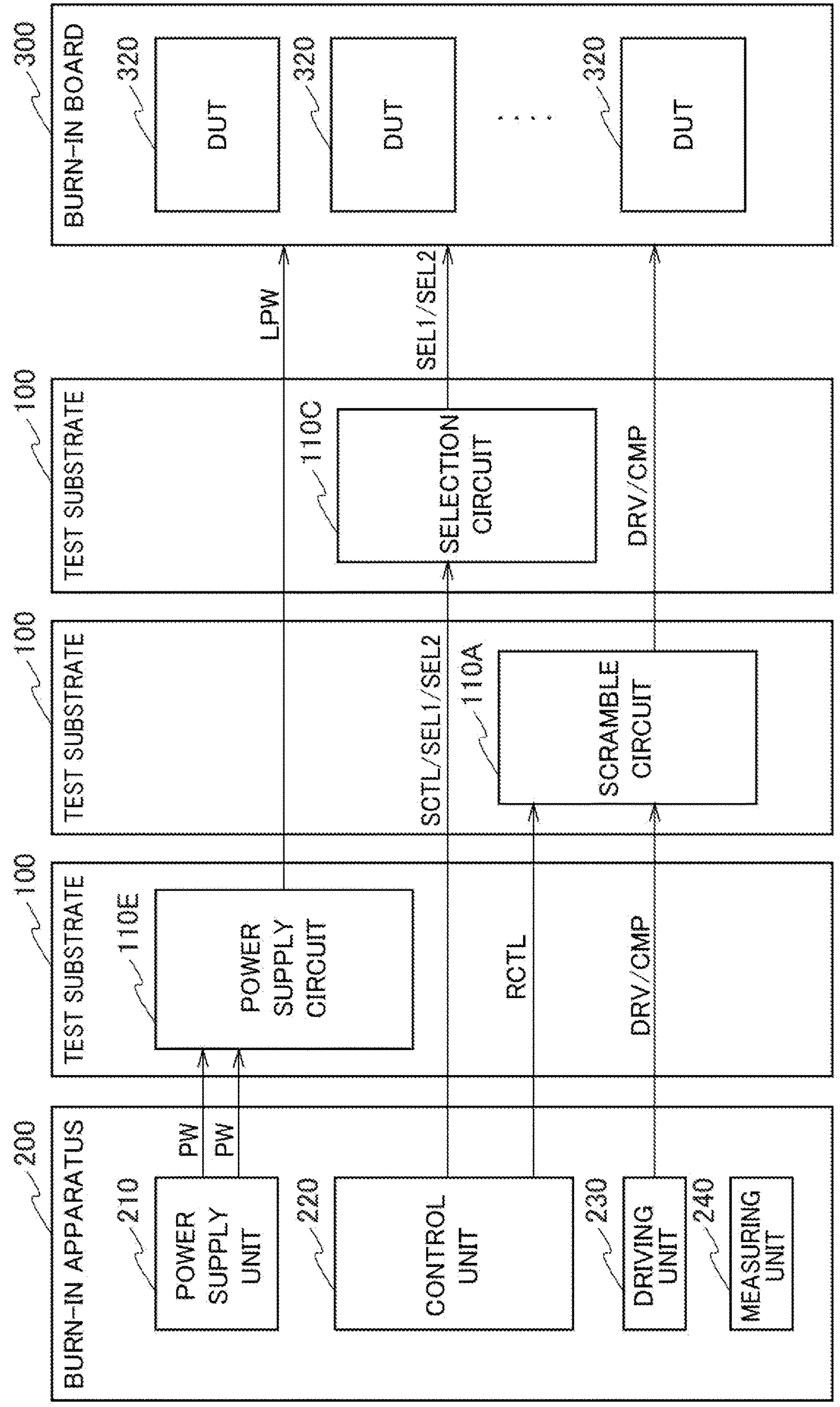
FIG. 23 is a block diagram schematically illustrating yet another example of a configuration of connecting a plurality of test substrates in series in the burn-in test apparatus according to the embodiments.

In FIG. 23, the test substrate 100 on which the input circuit for plurality of resources 110E mounted, the test substrate 100 on which the scramble circuit 110A is mounted, and the test substrate 100 on which the selection circuit 110C is mounted are connected and inserted in series between the burn-in apparatus 200 and the burn-in board 300.

Thus, the test substrate 100 is a substrate additionally inserted between the burn-in apparatus 200 and the burn-in board 300, and includes an edge connector 180 (same type of a connector as the edge connector 380 of the burn-in board 300) connected to the burn-in apparatus 200, and an edge connector socket 190 (same type of a socket as the edge connector socket 290 of the burn-in apparatus 200) connected to the burn-in board 300. Therefore, a plurality of types of test substrates 100 can be connected and inserted in series in accordance with the tests of DUTs 320.

(Processing Operation Example of Burn-In Test Apparatus 1 in Embodiments)

It is to be noted that processing operations of the burn-in test apparatus 1 according to the embodiments described below can also be described in a computer program as instructions to be executed by computers. The computer program is stored in, for example, a non-transitory computer readable medium and is used for the diagnostic system according to the embodiments.

(Processing Operation Example when Connecting Only Test Substrate on which Scramble is Circuit Mounted)

Figure 24:
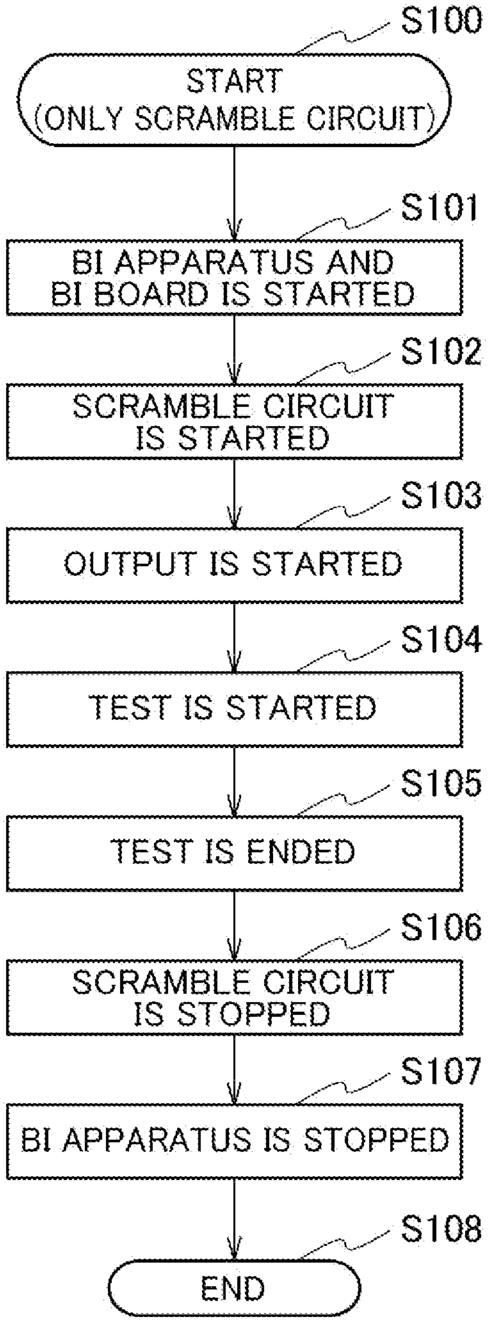
FIG. 24 is an outline flowchart illustrating an example of a processing operation when a test substrate on which a scramble circuit is mounted is connected, in the burn-in test apparatus according to the embodiments.
Figure 25:
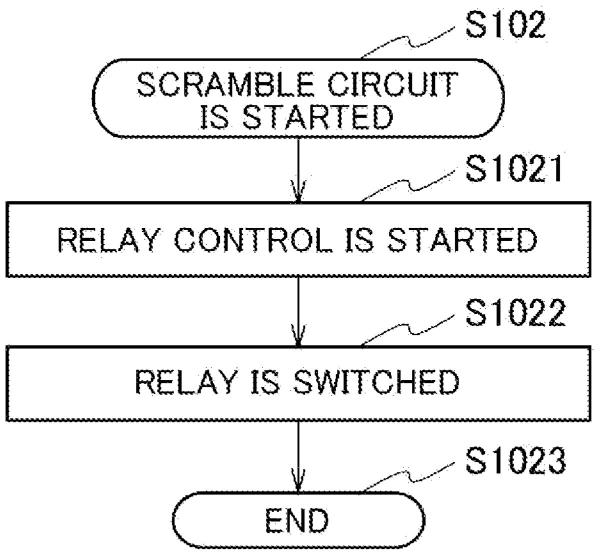
FIG. 25 is an outline flowchart illustrating an operation example of the scramble circuit starting process, in the flow chart illustrated in FIG. 24.
Figure 26:
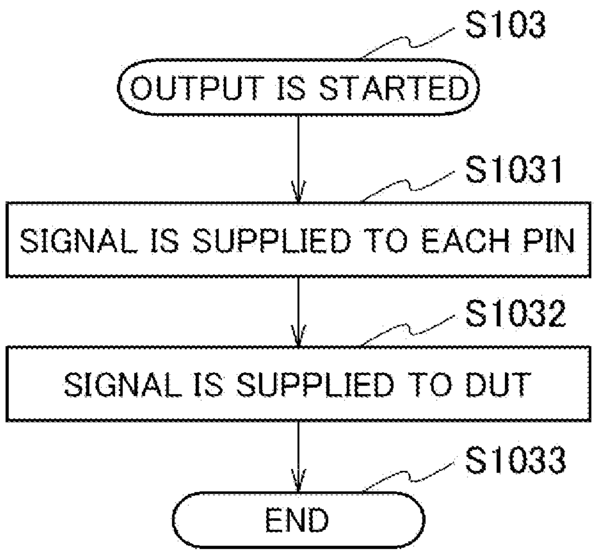
FIG. 26 is an outline flowchart illustrating an example of a processing operation of an output starting process, in the flow chart illustrated in FIG. 24.
Figure 27:
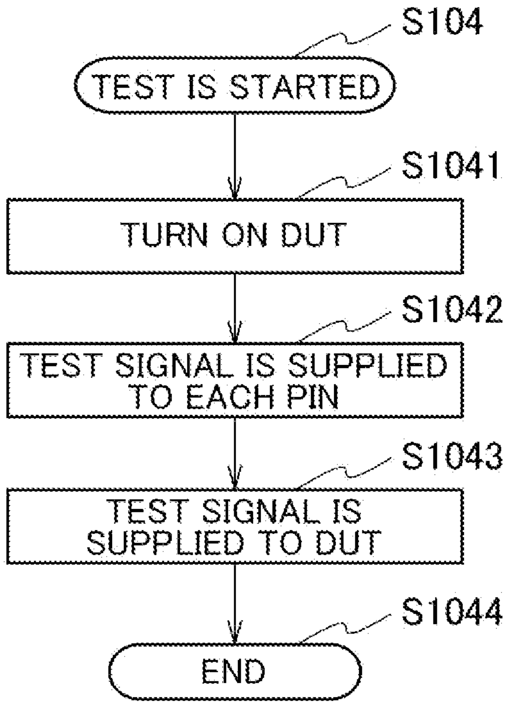
FIG. 27 is an outline flowchart illustrating an example of a processing operation of a test starting process, in the flow chart illustrated in FIG. 24.
Figure 28:
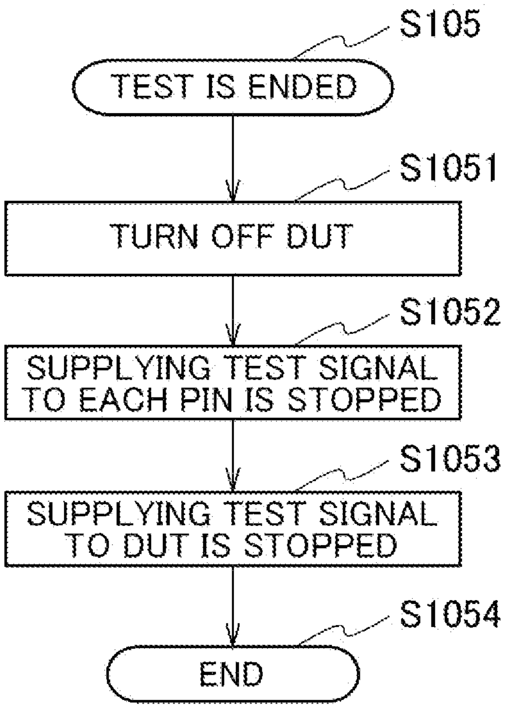
FIG. 28 is an outline flowchart illustrating an example of a processing operation of a test ending process, in the flow chart illustrated in FIG. 24.

FIG. 24 illustrates a processing operation example when a test substrate 100 on which a scramble circuit 110A is mounted is connected between the burn-in apparatus 200 and the burn-in board 300, in the burn-in test apparatus 1 according to the embodiments. Moreover, FIG. 25 illustrates a processing operation example of a scramble circuit starting process (Step S102) included in the flow chart illustrated in FIG. 24. FIG. 26 illustrates a processing operation example of an output starting process (Step S103) included in the flow chart illustrated in FIG. 24. FIG. 27 illustrates a processing operation example of a test starting process (Step S104) included in the flow chart illustrated in FIG. 24. FIG. 28 illustrates a processing operation example of a test ending process (Step S105) included in the flow chart illustrated in FIG. 24.

In Step S100 in FIG. 24, a processing operation in the case of connecting only the test substrate 100 on which the scramble circuit 110A is mounted between the burn-in apparatus 200 and the burn-in board 300 is started.

In Step S101, the burn-in apparatus 200 turns on the power supply of the burn-in board 300.

In Step S102, the scramble circuit 110A mounted on the test substrate 100 is started. Moving now to the flow chart illustrated in FIG. 25, in Step S1021, the burn-in apparatus 200 starts a relay control process of the scramble circuit 110A. Specifically, the burn-in apparatus 200 supplies a relay control signal RCTL to the scramble circuit 110A. In response, the scramble circuit 110A switches the relay element 111 to switch the pin assignment.

Returning now to the flow chart illustrated in FIG. 24, in Step S103, the burn-in apparatus 200 starts an output process. Moving now to the flow chart illustrated in FIG. 26, in Step S1031, the burn-in apparatus starts supplying of various signals, such as a control signal, to the pins at the burn-in board 300 side. In Step S1032, the burn-in board 300 supplies the various signals, such as the control signal, to the DUTs 320.

Returning now to the flow chart illustrated in FIG. 24, in Step S104, a test starting process is executed. Moving now to the flow chart illustrated in FIG. 27, in Step S1041, the burn-in board 300 turns on the power supply of the DUTs 320 mounted thereon. In Step S1042, the burn-in apparatus 200 supplies a test signal to each pin of the DUTs 320 mounted on the burn-in board 300 through the test substrate 100. In the burn-in board 300, in Step S1043, the test signal is supplied to the DUTs 320.

After the test of the DUTs 320 is completed, returning to the flow chart illustrated in FIG. 24, in Step S105, a test ending process is executed. Moving now to the flow chart illustrated in FIG. 28, in Step S1051, the burn-in board 300 turns off the power supply of the DUTs 320. In Step S1052, the burn-in apparatus 200 stops supplying the test signal to each pin through the test substrate 100. In Step S1044, the burn-in board 300 stops supplying the test signal to the DUTs 320.

Returning now to the flow chart illustrated in FIG. 24, in Step S106, a stopping process of the scramble circuit 110A is executed. Specifically, the burn-in apparatus 200 ends the relay control process of the scramble circuit 110A, and the burn-in board 300 stops the relay control switching process of the relay element 111.

In Step S107, the burn-in apparatus 200 turns off the power supply of the burn-in board 300, and, in Step S108, ends a series of processes.

(Processing Operation Example when Connecting Only Test Substrate on which Power Supply Circuit is Mounted)

Figure 29:
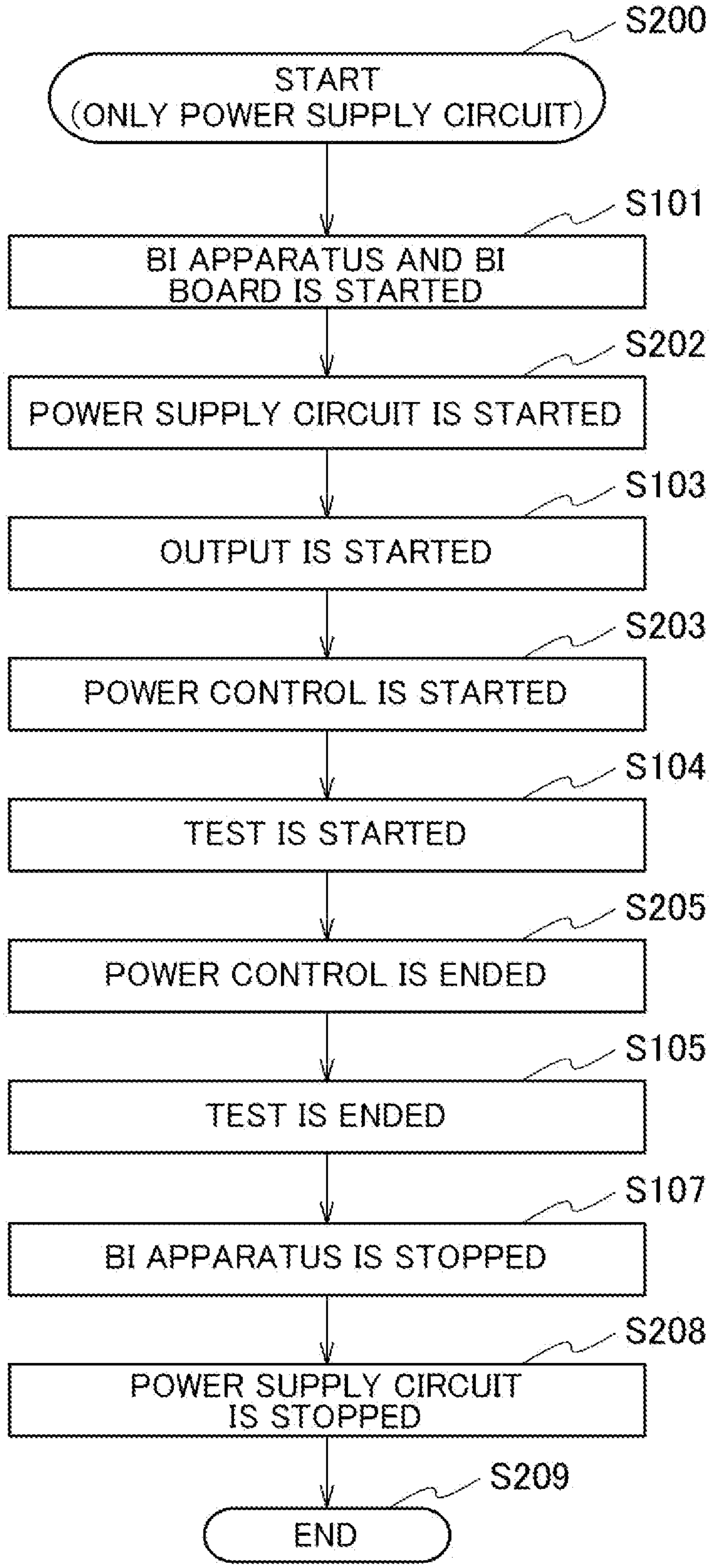
FIG. 29 is an outline flowchart illustrating an example of a processing operation when a test substrate on which a power supply circuit is mounted is connected, in the burn-in test apparatus according to the embodiments.
Figure 30:
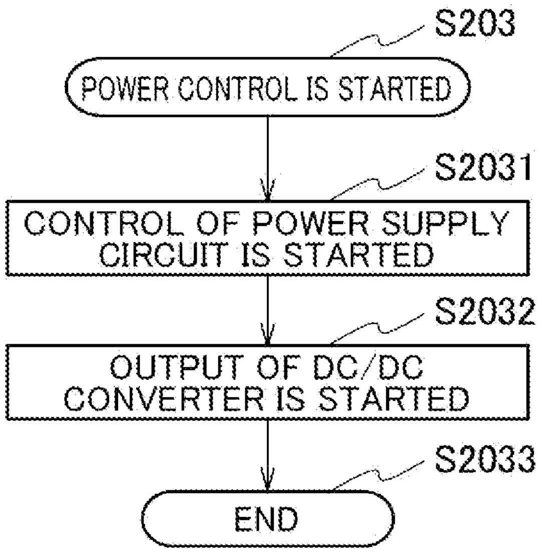
FIG. 30 is an outline flowchart illustrating an example of a processing operation of a power control starting process, in the flow chart illustrated in FIG. 29.
Figure 31:
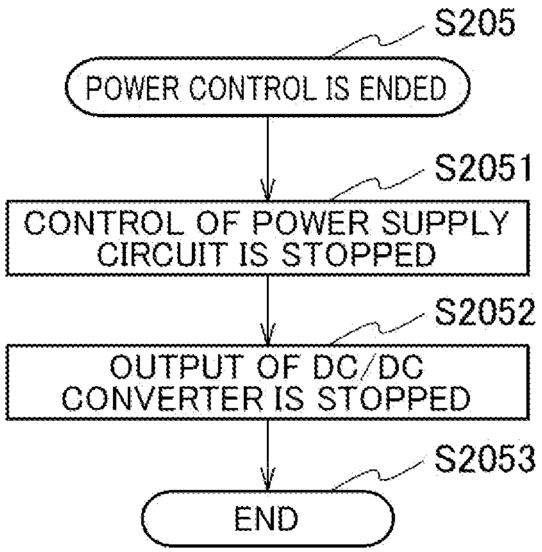
FIG. 31 is an outline flowchart illustrating an example of a processing operation of a power control ending process, in the flow chart illustrated in FIG. 29.

FIG. 29 illustrates a processing operation example when a test substrate 100 on which a power supply circuit 110B is mounted is connected, in the burn-in test apparatus 1 according to the embodiments. FIG. 30 illustrates a processing operation example of the power control starting process (Step S203) included in the flow chart illustrated in FIG. 29. FIG. 31 illustrates a processing operation example of the power control ending process (Step S205) included in the flow chart illustrated in FIG. 29. It should be noted that processing operations similar to the processing operations in the flow charts illustrated in FIGS. 24 to 28 are attached with the same reference signs, and descriptions thereof may be omitted.

In Step S200 in FIG. 29, a processing operation in the case of connecting only the test substrate 100 on which the power supply circuit 110B is mounted between the burn-in apparatus 200 and the burn-in board 300 is started.

In Step S101, the burn-in apparatus 200 turns on the power supply of the burn-in board 300.

In Step S202, the power supply circuit 110B mounted on the test substrate 100 is started. Specifically, a power supply circuit 110B turns on the power supply of the step-down DC/DC converter 112.

In Step S103, the burn-in apparatus 200 starts an output process. The processing operation in Step S103 is the same as the processing operation in Step S103 (Steps S1031 to S1033) described in the flow chart illustrated in FIG. 24 or the flow chart illustrated in FIG. 25.

In Step S203, the burn-in apparatus 200 starts a power control process. Moving now to the flow chart illustrated in FIG. 30, in Step S2031, the burn-in apparatus 200 starts a relay control process of the power supply circuit 110B. Specifically, the burn-in apparatus 200 supplies a power supply control signal PCTL to the power supply circuit 110B. In response, the power supply circuit 110B starts an output process of the step-down DC/DC converter 112. The power supply voltage PW supplied from the burn-in apparatus 200 is stepped down by the step-down DC/DC converter 112 to a necessary and sufficient voltage region for burn-in tests and is supplied to the burn-in board 300 side.

Returning now to the flow chart illustrated in FIG. 29, in Step S104, a test starting process is executed. The processing operation in Step S104 is the same as the processing operation in Step S104 (Steps S1041 to S1044) described in the flow chart illustrated in FIG. 24 or the flow chart illustrated in FIG. 27.

After the test of the DUTs 320 is completed, returning to the flow chart illustrated in FIG. 29, the burn-in apparatus 200 ends the power control process in Step S205. Moving now to the flow chart illustrated in FIG. 31, in Step S2051, the burn-in apparatus 200 ends the relay control process of the power supply circuit 110B. In response, the power supply circuit 110B stops the output process of the step-down DC/DC converter 112.

Returning now to the flow chart illustrated in FIG. 29, in Step S105, burn-in apparatus 200 executes a test ending process. The processing operation in Step S105 is the same as the processing operation in Step S105 (Steps S1051 to S1054) described in the flow chart illustrated in FIG. 24 or the flow chart illustrated in FIG. 28.

In Step S107, in Step S208, the burn-in apparatus 200 turns off the power supply of the burn-in board 300, turns off the power supply of the power supply circuit 110B, and, in Step S209, ends a series of the processes.

(Processing Operation Example when Connecting Test Substrate on which Scramble Circuit is Mounted and Test Substrate on which Power Supply Circuit is Mounted)

Figure 32:
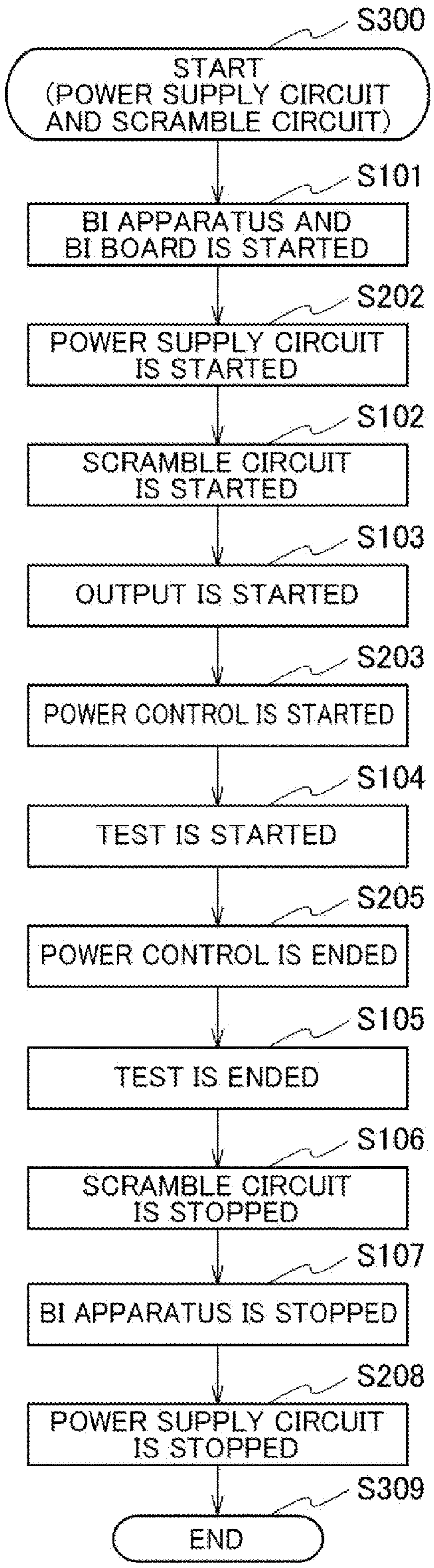
FIG. 32 is an outline flowchart illustrating an example of a processing operation when a test substrate on which a scramble circuit is mounted and a test substrate on which a power supply circuit is mounted are connected, in the burn-in test apparatus according to the embodiments.

FIG. 32 illustrates a processing operation example when a test substrate 100 on which a scramble circuit 110A is mounted and a test substrate 100 on which a power supply circuit 110B is mounted are connected, in the burn-in test apparatus 1 according to the embodiments. It should be noted that processing operations similar to the processing operations in the flow charts illustrated in FIGS. 24 to 31 are attached with the same reference signs, and descriptions thereof may be omitted.

In Step S300 in FIG. 32, started is a processing operation when the test substrate 100 on which the power supply circuit 110B is mounted and the test substrate 100 on which the power supply circuit 110B is mounted are connecting between the burn-in apparatus 200 and the burn-in board 300.

In Step S101, the burn-in apparatus 200 turns on the power supply of the burn-in board 300.

In Step S202, the power supply circuit 110B mounted on the test substrate 100 is started. Specifically, the power supply circuit 110B turns on the power supply of the step-down DC/DC converter 112.

In Step S102, the scramble circuit 110A mounted on the test substrate 100 is started. The processing operation in Step S102 is the same as the processing operation in Step S102 (Steps S1021 to S1023) described in the flow chart illustrated in FIG. 24 or the flow chart illustrated in FIG. 25.

In Step S103, the burn-in apparatus 200 starts an output process. The processing operation in Step S103 is the same as the processing operation in Step S103 (Steps S1031 to S1033) described in the flow chart illustrated in FIG. 24 or the flow chart illustrated in FIG. 25.

In Step S203, the burn-in apparatus 200 starts a power control process. The processing operation in Step S203 is the same as the processing operation in Step S203 (Steps S2031 to S2033) described in the flow chart illustrated in FIG. 29 or the flow chart illustrated in FIG. 30.

In Step S104, the burn-in apparatus 200 executes a test starting process. The processing operation in Step S104 is the same as the processing operation in Step S104 (Steps S1041 to S1044) described in the flow chart illustrated in FIG. 24 or the flow chart illustrated in FIG. 27.

In Step S205, the burn-in apparatus 200 ends the power control process. The processing operation in Step S205 is the same as the processing operation in Step S205 (Steps S2051 to S2053) described in the flow chart illustrated in FIG. 29 or the flow chart illustrated in FIG. 31.

In Step S105, the burn-in apparatus 200 executes a test ending process. The processing operation in Step S105 is the same as the processing operation in Step S105 (Steps S1051 to S1054) described in the flow chart illustrated in FIG. 24 or the flow chart illustrated in FIG. 28.

In Step S106, the burn-in apparatus 200 executes a stopping process of the scramble circuit 110A. The processing operation in Step S106 is the same as the processing operation in Step S106 described in the flow chart illustrated in FIG. 24.

In Step S107, in Step S208, the burn-in apparatus 200 turns off the power supply of the burn-in board 300, turns off the power supply of the power supply circuit 110B, and, in Step S309, ends a series of the processes.

Effects Produced from Embodiments

According to the embodiments, the following effects can be obtained.

Even when the pin assignments between the burn-in apparatus and burn-in board are not unified and there are incompatible combinations, it is possible to support individual tests of semiconductor integrated circuits with built-in controllers without requiring changes according to the pin assignments on the burn-in apparatus side. Moreover, since it is configured to change the pin assignment to be sent to the burn-in board side without changing the input pattern from the burn-in apparatus, there is no need for a special storage device to store the input pattern.

The power supply capacity provided by the burn-in apparatus can be efficiently used for testing. Moreover, since the switching regulator is mounted on the test substrate and does not need to be mounted on the burn-in board side, for example, merely the test substrate needs to be maintained in case of failure.

The number of simultaneous measurements of the DUTs can be flexibly adjusted, and thereby environmental variations, such as variation in the temperature inside the test furnace, can be suppressed. Moreover, there is no need to mount sensors, or the like on the burn-in board, and it can be supported by merely adding the test substrate for switching control or changing the control of the test program.

Therefore, according to the embodiments, it is possible to provide a test substrate for a semiconductor integrated circuit, a test apparatus, and a test method, capable of efficiently using resources in a burn-in apparatus, capable of absorbing structural differences between respective DUTs, and capable of suppressing environmental variations in a test furnace.

Other Embodiments

While certain embodiments have been described, these embodiments have been presented by way of examples only, and are not intended to limit the scope of the inventions. Indeed, the novel substrates, apparatuses, and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, a test circuit 110 may include two or more of the scramble circuit 110A, the power supply circuit 110B, the switching circuit 110C, the switch circuit 110D, and the input circuit for plurality of resources 110E.

What is claimed is:

1. A test substrate for a semiconductor integrated circuit, the test substrate comprising:

a substrate connected between a burn-in apparatus and a burn-in board on which the semiconductor integrated circuit which is a device under test is mounted;

a test circuit disposes on the substrate, the test circuit configured to extend a connection interface configuration between the burn-in apparatus and the burn-in board;

an edge connector for connecting to the burn-in apparatus;

and an edge connector socket connected to the burn-in board, wherein the test circuit comprises at least one selected from the group consisting of:

a scramble circuit comprising a relay element for interchanging a pin assignment between the burn-in apparatus and the burn-in board;

a power supply circuit comprising a DC/DC converter configured to step down a power supply voltage to be supplied to the burn-in board from the burn-in apparatus;

a switching circuit configured to mask a signal supplied from the burn-in apparatus to the burn-in board and to switch the signal for each burn-in board;

a switch circuit configured to select a signal supplied from the burn-in apparatus to the burn-in board; and an input circuit for plurality of resources configured to supply resources of a plurality of slots from the burn-in apparatus to the one burn-in board.

2. The test substrate according to claim 1, wherein the test circuit comprises at least two selected from the group consisting of:

the scramble circuit;

the power supply circuit;

the switching circuit;

the switch circuit; and the input circuit for plurality of resources.

3. A test apparatus for a semiconductor integrated circuit, the test apparatus comprising:

a burn-in apparatus;

a burn-in board on which the semiconductor integrated circuit which is a device under test is mounted; and a test substrate connected between the burn-in apparatus and the burn-in board, wherein the test substrate comprises:

a test circuit configured to extend a connection interface configuration between the burn-in apparatus and the burn-in board;

an edge connector for connecting to the burn-in apparatus; and an edge connector socket connected to the burn-in board, and the test circuit comprises at least one selected from the group consisting of:

a scramble circuit comprising a relay element for interchanging a pin assignment between the burn-in apparatus and the burn-in board;

a power supply circuit comprising a DC/DC converter configured to step down a power supply voltage to be supplied to the burn-in board from the burn-in apparatus;

a switching circuit configured to mask a signal supplied from the burn-in apparatus to the burn-in board and to switch the signal for each burn-in board;

a switch circuit configured to select a signal supplied from the burn-in apparatus to the burn-in board; and an input circuit for plurality of resources configured to supply resources of a plurality of slots from the burn-in apparatus to the one burn-in board.

4. The test apparatus according to claim 3, wherein the test circuit comprises the scramble circuit, and the relay element can be controlled from the burn-in apparatus.

5. The test apparatus according to claim 3, wherein the test circuit comprises at least two selected from the group consisting of:

the scramble circuit;

the power supply circuit;

the switching circuit;

the switch circuit; and the input circuit for plurality of resources.

6. The test apparatus according to claim 3, wherein the test circuit comprising a plurality of test circuits connected in series between the burn-in apparatus and the burn-in board, wherein each of the test circuits comprises one selected from the group consisting of:

the scramble circuit;

the power supply circuit;

the switching circuit;

the switch circuit; and the input circuit for plurality of resources.

7. A test method used for a test apparatus for a semiconductor integrated circuit, the test apparatus comprising a burn-in apparatus, a burn-in board on which the semiconductor integrated circuit which is a device under test is mounted, and a test substrate comprising a test circuit connected between the burn-in apparatus and the burn-in board and configured to extend a connection interface configuration between the burn-in apparatus and the burn-in board, the test method comprising:

starting, by the burn-in apparatus, the burn-in board;

starting, by the burn-in board, the test circuit;

extending, by the test circuit, the connection interface configuration;

executing, by the burn-in board, a test of the device under test mounted on the burn-in board;

ending, by the burn-in board, the test of the device under test mounted on the burn-in board;

stopping, by the burn-in board, the test circuit; and stopping, by the burn-in apparatus, the burn-in board wherein the extending the connection interface configuration comprises at least any one of:

interchanging, by a relay element, a pin assignment between the burn-in apparatus and the burn-in board;

stepping down, by a DC/DC converter, a power supply voltage supplied from the burn-in apparatus to the burn-in board;

masking, by a switching circuit, a signal supplied from the burn-in apparatus to the burn-in board, and switching the signal for each burn-in board;

selecting, a switch circuit, the signal supplied from the burn-in apparatus to the burn-in board; and supplying, by an input circuit for plurality of resources, resources of a plurality of slots from the burn-in apparatus to one burn-in board.

* * * * *